United States Patent [19]
Ono et al.

[11] Patent Number: 5,541,748
[45] Date of Patent: Jul. 30, 1996

[54] LIQUID CRYSTAL DISPLAY HAVING PATTERNED INSULATING AND SEMICONDUCTOR LAYERS AND A METHOD OF FABRICATING THE SAME

[75] Inventors: Kikuo Ono, Naka-machi; Junichi Ohwada, Mobara; Hideaki Yamamoto, Tokorozawa; Hiroaki Asuma, Hitachi; Nobutake Konishi, Hitachioota, all of Japan

[73] Assignee: Hitachi, Ltd., Tokyo, Japan

[21] Appl. No.: 255,958

[22] Filed: Jun. 7, 1994

[30] Foreign Application Priority Data

Jun. 7, 1993 [JP] Japan ................... 5-136148

[51] Int. Cl.⁶ .............. G02F 1/1343; G02F 1/1333
[52] U.S. Cl. ............... 359/59; 359/58; 359/79; 359/87
[58] Field of Search ................. 359/59, 87, 58, 359/79

[56] References Cited

U.S. PATENT DOCUMENTS

| | | | |
|---|---|---|---|
| 5,032,531 | 7/1991 | Tsutsui et al. | 359/59 |
| 5,055,899 | 10/1991 | Wakai et al. | 359/59 |
| 5,187,602 | 2/1993 | Ikeda et al. | 359/59 |

*Primary Examiner*—Rolf Hille
*Assistant Examiner*—Fetsum Abraham
*Attorney, Agent, or Firm*—Antonelli, Terry, Stout & Kraus

[57] ABSTRACT

A liquid crystal display provided with a matrix of inverted-stagger thin-film transistors has a plurality of gate insulating films formed over gate lines and including one insulating film formed in contact with gate electrodes of the thin-film transistors and in self-alignment with gate lines in the picture display area of the liquid crystal display. The rest of the gate insulating films not crossing the gate electrodes and in contact with a semiconductor layer are patterned in conformity with drain electrodes (data lines), and a semiconductor layer and an insulating film not crossing the drain electrode and crossing the gate electrodes are patterned at the same time. The method has less steps than the conventional method, is capable of fabricating a liquid crystal display capable of displaying pictures in a high picture quality at a high yield rate.

21 Claims, 31 Drawing Sheets

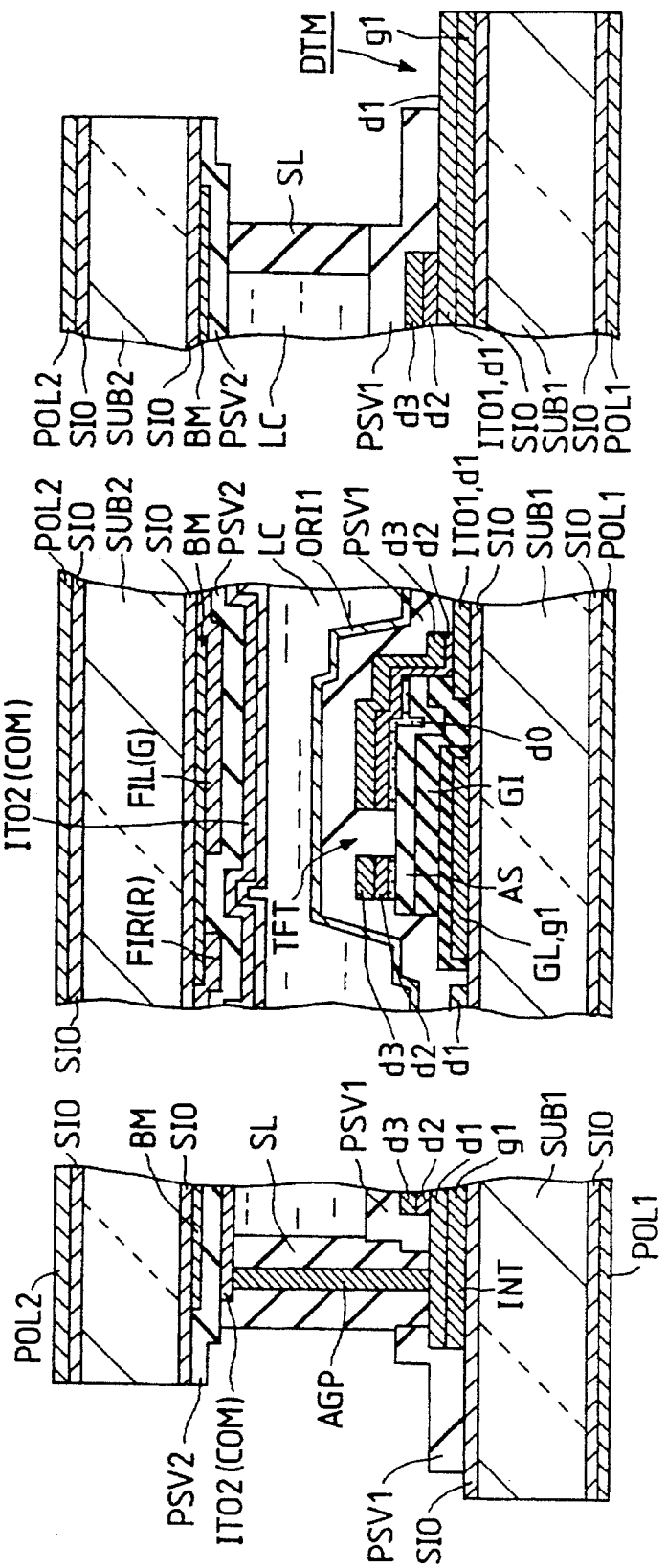

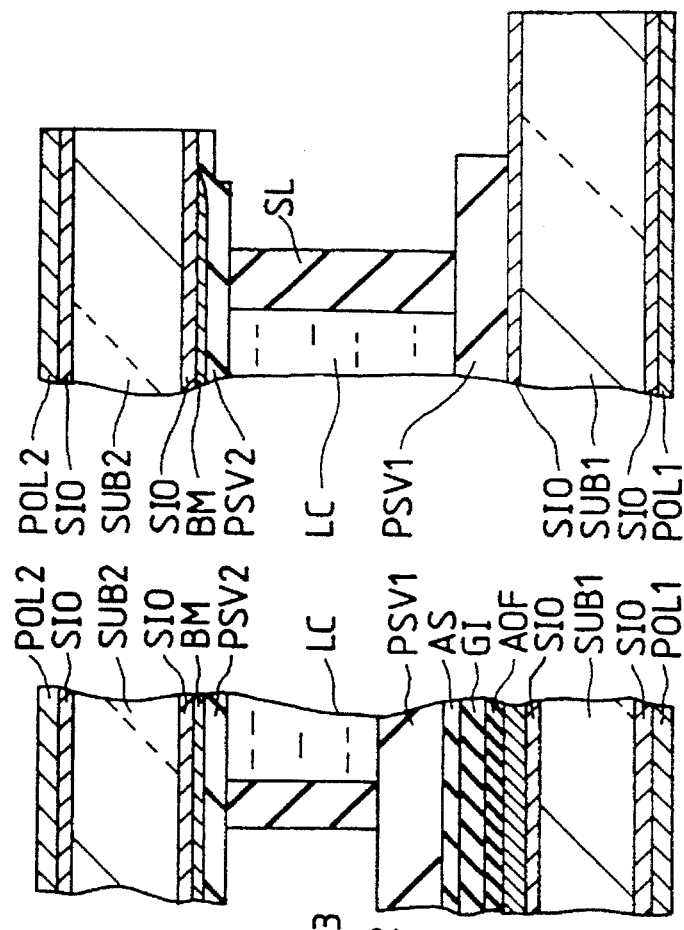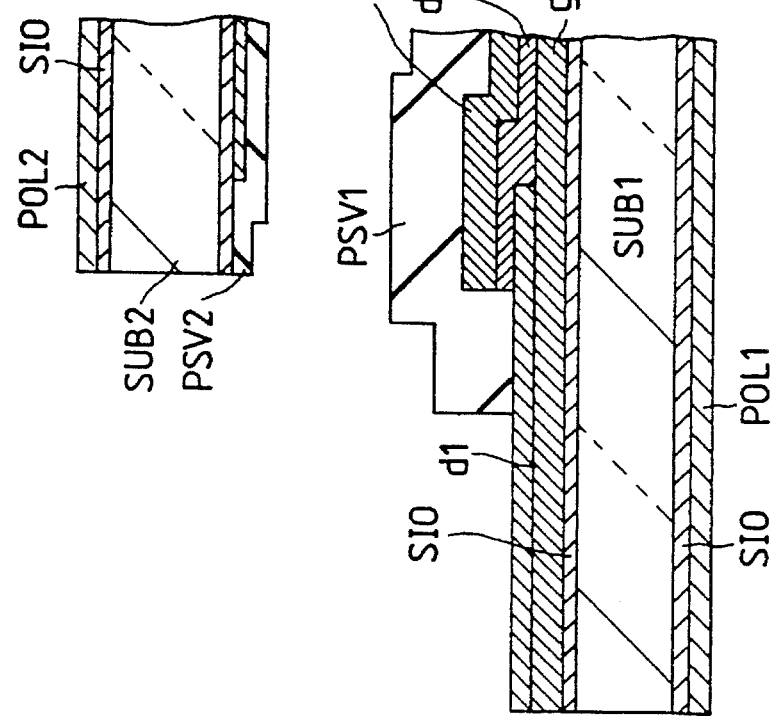

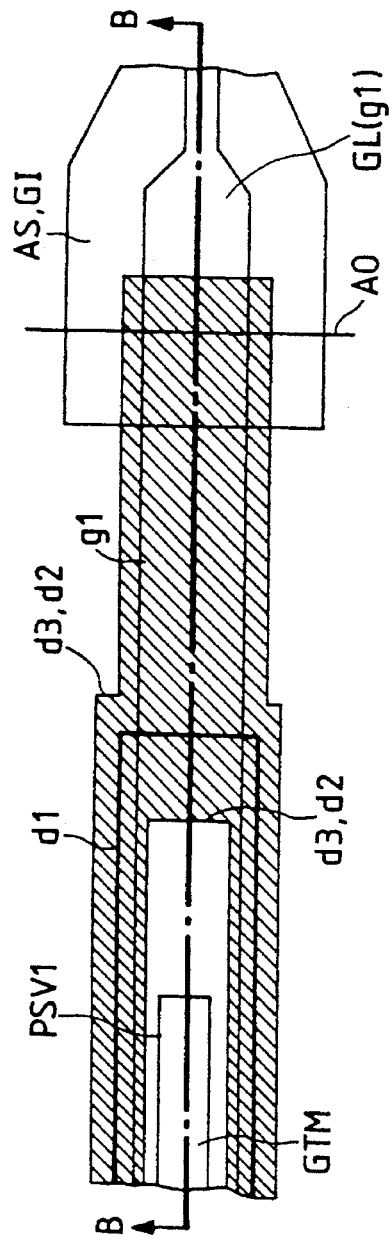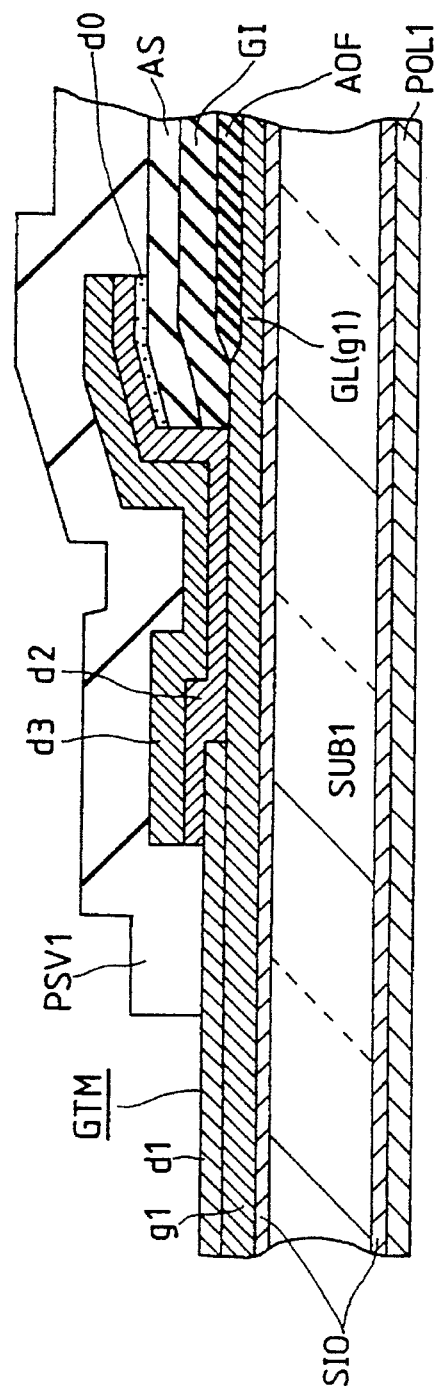

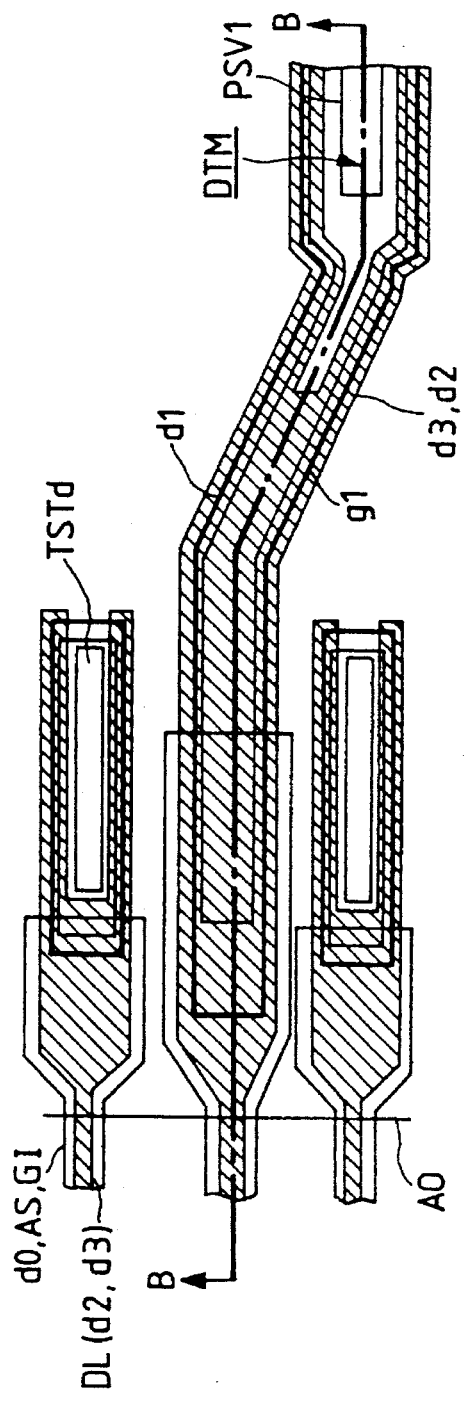
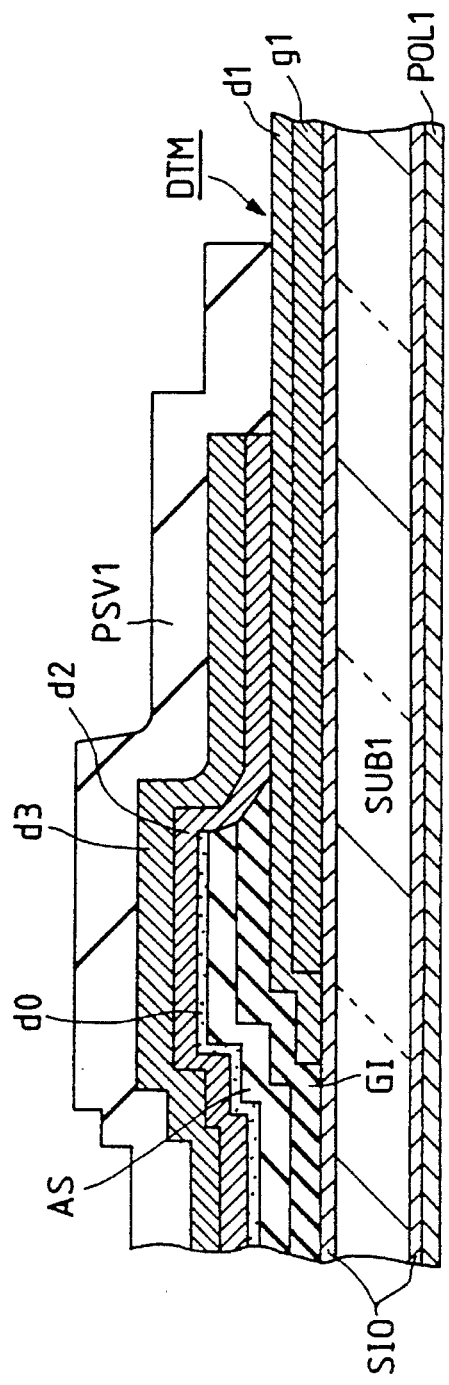
FIG. 14
FIG. 15

INCLINATION θ

| | AFTER a-Si FILM ETCHING, | AFTER SiN FILM ETCHING, |
|---|---|---|
| d0 | 90 DEG. | 90 DEG. |
| AS | 70 DEG. | 50 DEG. |
| GI | — | 20 DEG. | ns
LIQUID CRYSTAL DISPLAY HAVING PATTERNED INSULATING AND SEMICONDUCTOR LAYERS AND A METHOD OF FABRICATING THE SAME

BACKGROUND OF THE INVENTION

Field Of Utilization In Industry

The present invention relates to a liquid crystal display of an active matrix type employing thin-film transistors (TFTs), and a method of fabricating such a liquid crystal display.

In an active matrix type liquid crystal display, pixel electrodes arranged in a matrix area are connected respectively to switching elements. Since portions of the liquid crystal material corresponding to the pixels of the active matrix liquid crystal display are driven theoretically in a continuous manner, the contrast of a picture displayed on the active matrix liquid crystal display is higher than that displayed on the simple matrix liquid crystal display. Such an advantage of the active matrix liquid crystal display is essential to displaying color pictures.

In a TFT incorporated into the conventional active matrix liquid crystal display, gate lines (gate electrode) are formed on an insulating substrate, a gate insulating film is formed over the gate lines, a semiconductor layer is formed over the gate insulating film, a drain electrode and a source electrode are formed on the semiconductor layer, a transparent pixel electrode is connected to the source electrode, and a data signal, i.e., a voltage signal, is applied to the drain electrode. The construction of a TFT having a gate electrode formed directly on the substrate is generally referred to as an inverted staggered construction. Such an active matrix liquid crystal display is disclosed in Japanese Patent Laid-open (Kokai) No. 62-32651.

Although the liquid crystal display employing TFTs is capable of being driven in an active drive mode and hence is capable of displaying pictures in a high contrast, the formation of the TFTs on the substrate requires complicated processes, including six to nine photolithographic etching processes. These many complicated processes increase the manufacturing cost of the substrate provided with TFTs and reduces the yield of the TFT production line, because an increase in the number of processes increases the possibility of contamination by dust and foreign matter.

A method proposed to simplify the TFT fabricating processes involves formation of the gate insulating film and the semiconductor layer simultaneously in the same pattern However, this known method has problems in that defects in the lines due to a short circuit between the drain electrodes or the source electrodes, the gate lines increase if the drain electrodes (data lines) or the source electrodes are not formed in a correct pattern, the breakage of the data lines at steps increases because the semiconductor layer and the gate insulating films are patterned in lands and form steps, the formation of the pixel electrodes and the gate lines and the data lines on the same layer increases defects attributable to defective points, and leakage currents increase to deteriorate the quality of displayed pictures when the semiconductor layer is formed of amorphous silicon having a high light sensitivity and the semiconductor layer is illuminated for backlighting.

SUMMARY OF THE INVENTION

It is an object of the present invention to improve the foregoing characteristics or provide a trade-off between those characteristics and to provide a substrate having thin-film transistors and a liquid crystal display capable of displaying pictures with a high picture quality and which is fabricated through a comparatively small number of processes at a high yield rate.

The features of the present invention are as follows:

In a liquid crystal display comprising a substrate, gate lines formed on the substrate, data lines formed so as to intersect the gate lines, thin-film transistors formed near the intersections of the gate lines and the data lines, and pixel electrodes connected to the thin-film transistors to drive a liquid crystal material:

1. an insulating layer and a semiconductor layer are formed substantially in the same plane pattern, along the data lines and so as to partially overlap the pixel electrodes;
2. an insulating layer and a semiconductor layer are formed substantially in the same plane pattern, along the data lines and with a width greater than that of the data lines, and have a function to absorb light reflected in the inside of the liquid crystal display;
3. each of the thin-film transistors has a source electrode and a drain electrode, an insulating layer and a semiconductor layer are formed substantially in the same plane pattern across the source electrode and the drain electrode, and an anodic oxide film is formed between the gate lines and the patterns of the insulating layer and the semiconductor layer;
4. each of the thin-film transistors has a gate insulating layer and a semiconductor layer, and the inclination of the edge of the layer further from the substrate to the substrate is smaller than that of the edge of the layer nearer to the substrate; or
5. areas between the periphery of the planar pattern of the semiconductor layer of the thin-film transistors and the periphery of the planar pattern of source electrodes or drain electrodes have a staggered pattern.

In a method of fabricating a liquid crystal display comprising a substrate, gate lines formed on the substrate, data lines formed so as to intersect the gatelines, thin-film transistors formed near the intersections of the gate lines and the data lines, and pixel electrodes connected to the thin-film transistors to drive a liquid crystal material there is provided:

6. an anodizing process for anodizing the surface of the gate lines formed on the substrate, and an etching process for continuously patterning an insulating film and a semiconductor layer substantially in the same plane pattern so as to coat at least part of the anodized oxide film.

The number of steps of a photolithographic etching process can be reduced because the insulating film and the semiconductor layer are formed by a patterning process provided substantially in the same plane pattern, and a short circuit between the gate lines and the data lines can be prevented by the insulating film formed by self-matching over the data lines even if the data lines are not formed in a correct pattern because the insulating film in contact with the gate lines is not etched for patterning. Steps in the layer underlying the data lines are small and hence the data lines are not likely to break because the insulating film in contact with the semiconductor layer is patterned along the data lines. The arrangement of the pixel electrodes in the middle of the insulating film and the semiconductor layer with respect to the thickness of the insulating film and the semiconductor layer (the insulating film in contact with the gate lines, the insulating film in contact with the semiconductor layer, and the semiconductor layer) reduces point defects. The semiconductor layer capable of absorbing internally reflected light and formed along the data lines absorbs the light that falls on the back surface of the insulating substrate to reduce the quantity of light reflected by the internal metallic components and to improve the contrast of pictures displayed on the liquid crystal display particularly when the ambience of the liquid crystal display is bright.

The features of the present invention will become apparent from the description taken in connection with the accompanying drawings.

BRIEF DESCRIPTION OF THE DRAWINGS

FIGS. 10(a), 10(b) and 10(c) are sectional views of respective portions of the display panel.

FIGS. 11(a) and 11(b) are sectional views of a data signal terminal, and a peripheral area of the display panel.

FIG. 12 is a plan view of a gate circuit connecting terminal GTM and a gate line GL connected to the gate circuit connecting terminal GTM.

FIG. 13 is a sectional view of the gate circuit connecting terminal GTM and the gate line GL connected to the gate circuit connecting terminal GTM.

FIG. 14 is a sectional view of a data signal circuit connecting terminal DTM and a data line L connected to the data signal circuit connecting terminal DTM.

FIG. 15 is a sectional view of the data signal circuit connecting terminal DTM and the data line DL connected to the data signal circuit connecting terminal DTM.

DESCRIPTION OF THE PREFERRED EMBODIMENT

FIRST EMBODIMENT

Active Matrix Liquid Crystal Display

Figure 1:
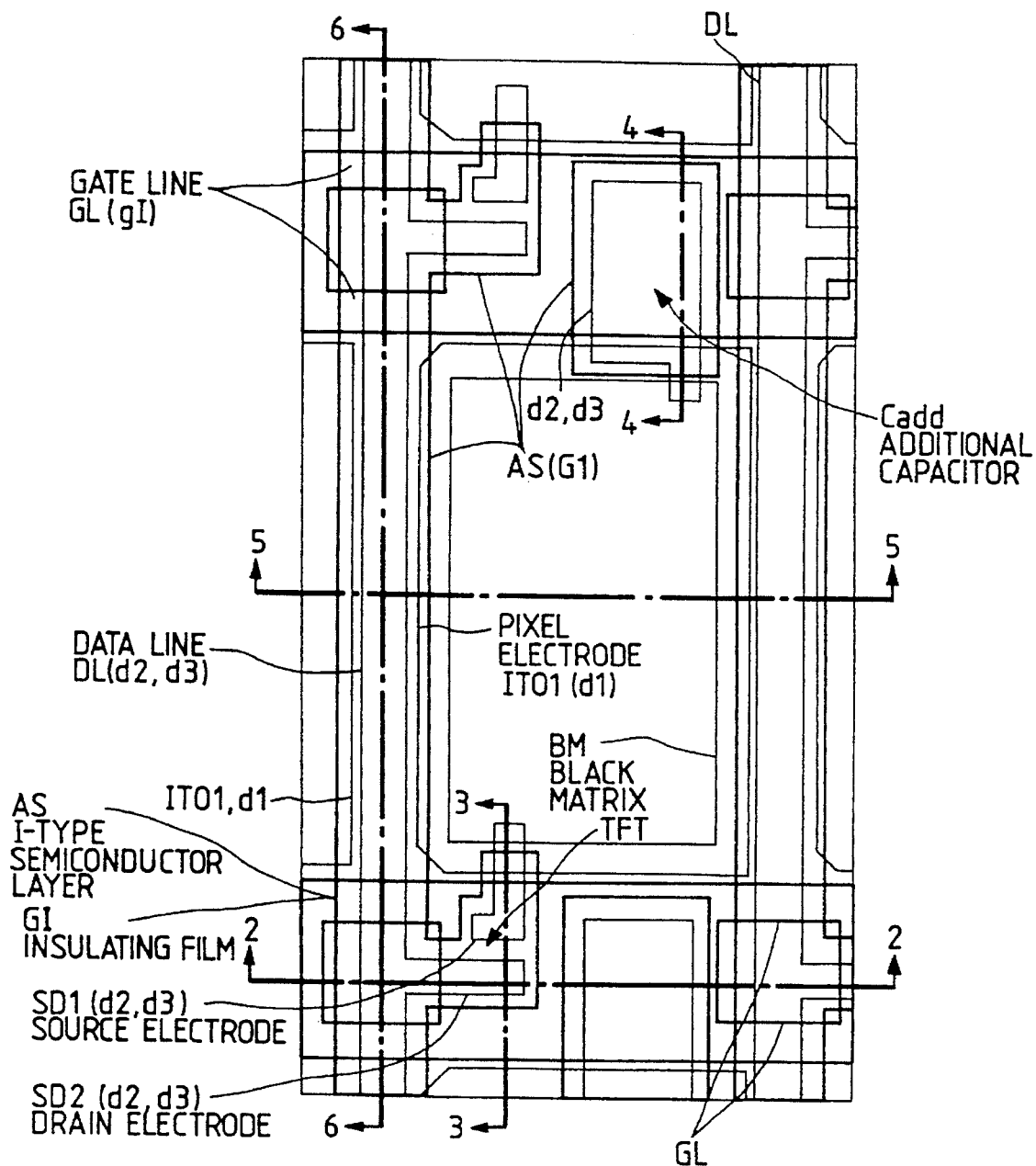
FIG. 1 is a plan view of an exemplary portion of an active matrix color liquid crystal display in a first embodiment according to the present invention.

An active matrix color liquid crystal display in a preferred embodiment according to the present invention will be described hereinafter with reference to the accompanying drawings, in which like parts are denoted by the same reference characters and the duplicate description thereof will be omitted.

Matrix

Referring to FIG. 1, a pixel is disposed in an area defined by two adjacent gate lines GL and two adjacent data lines DL intersecting the gate lines GL, namely, an area surrounded by four signal lines. The pixel comprises a thin-film transistor TFT, a transparent pixel electrode ITO1 and an additional capacitor Cadd. A part of the gate line GL near the intersection of the gate line GL and the data line DL is divided into two lines. In case one of the two lines of the gate line GL is short-circuited to the data line DL, the short-circuited line is cut with a laser beam and the other line is used so that the liquid crystal display is able to function normally.

Figure 3:
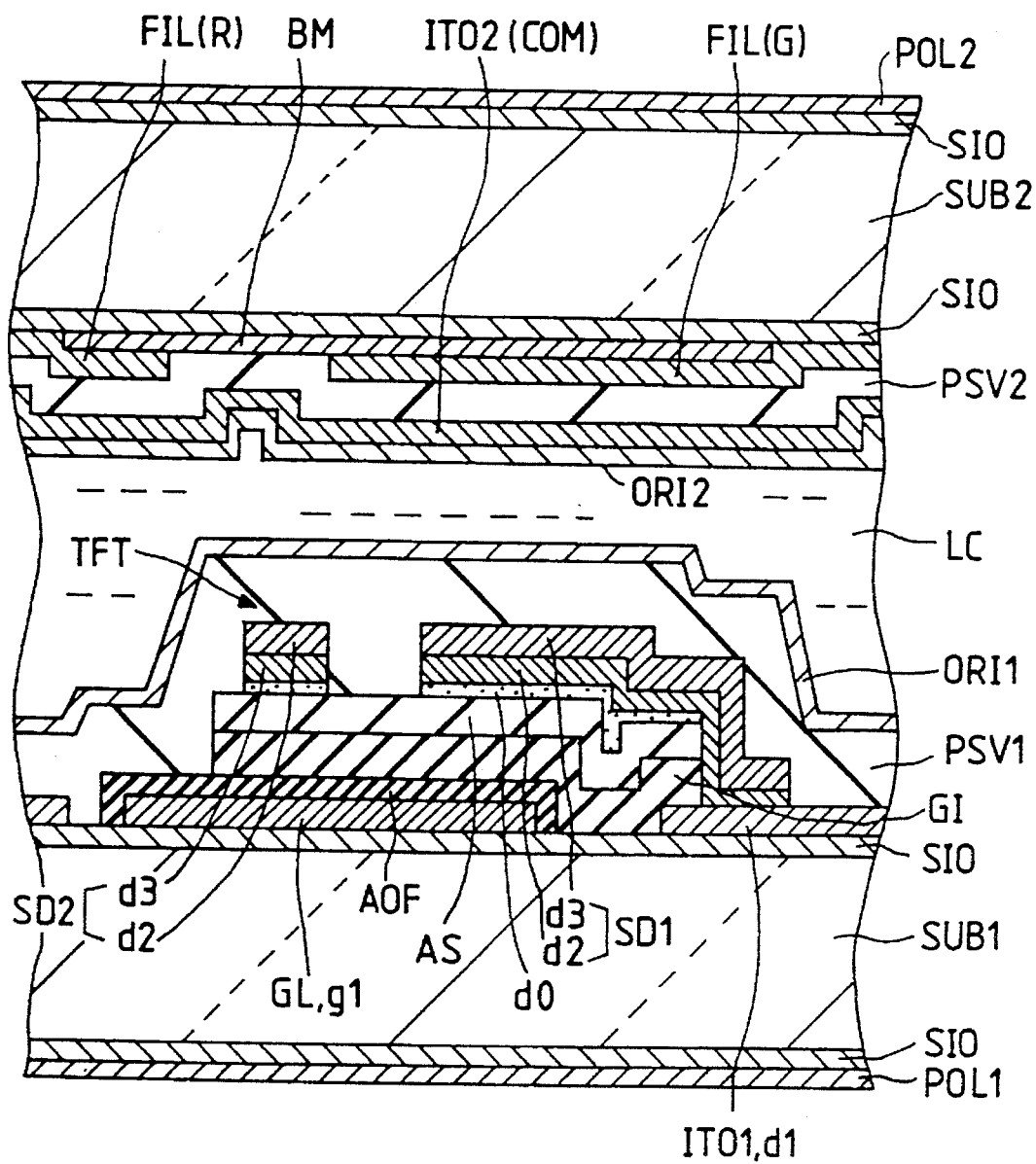
FIG. 3 is a sectional view taken on line 3—3 in FIG. 1.

As shown in FIG. 3, the thin-film transistor TFT and the transparent pixel electrode ITO1 are formed on the side (or inner main surface) of a lower transparent glass substrate SUB1 with respect to a liquid crystal layer LC, and a color filter FIL and a shading film BM are formed on the side (or inner main surface) of an upper transparent glass substrate SUB 2 with respect to the liquid crystal layer LC. The opposite surfaces (or outer main surfaces) of the transparent glass substrates SUB1 and SUB2 are coated with silicon dioxide films SIO formed by a dipping process.

The shading film BM, the color filter FIL, a protective film PSV2, a transparent common pixel electrode IT02 (COM) and an upper orientation film ORI2 are formed sequentially in that order on the inner surface, i.e., the surface on the side of the liquid crystal layer LC, of the upper transparent glass substrate SUB2.

Area Surrounding the Matrix Area

Figure 7:
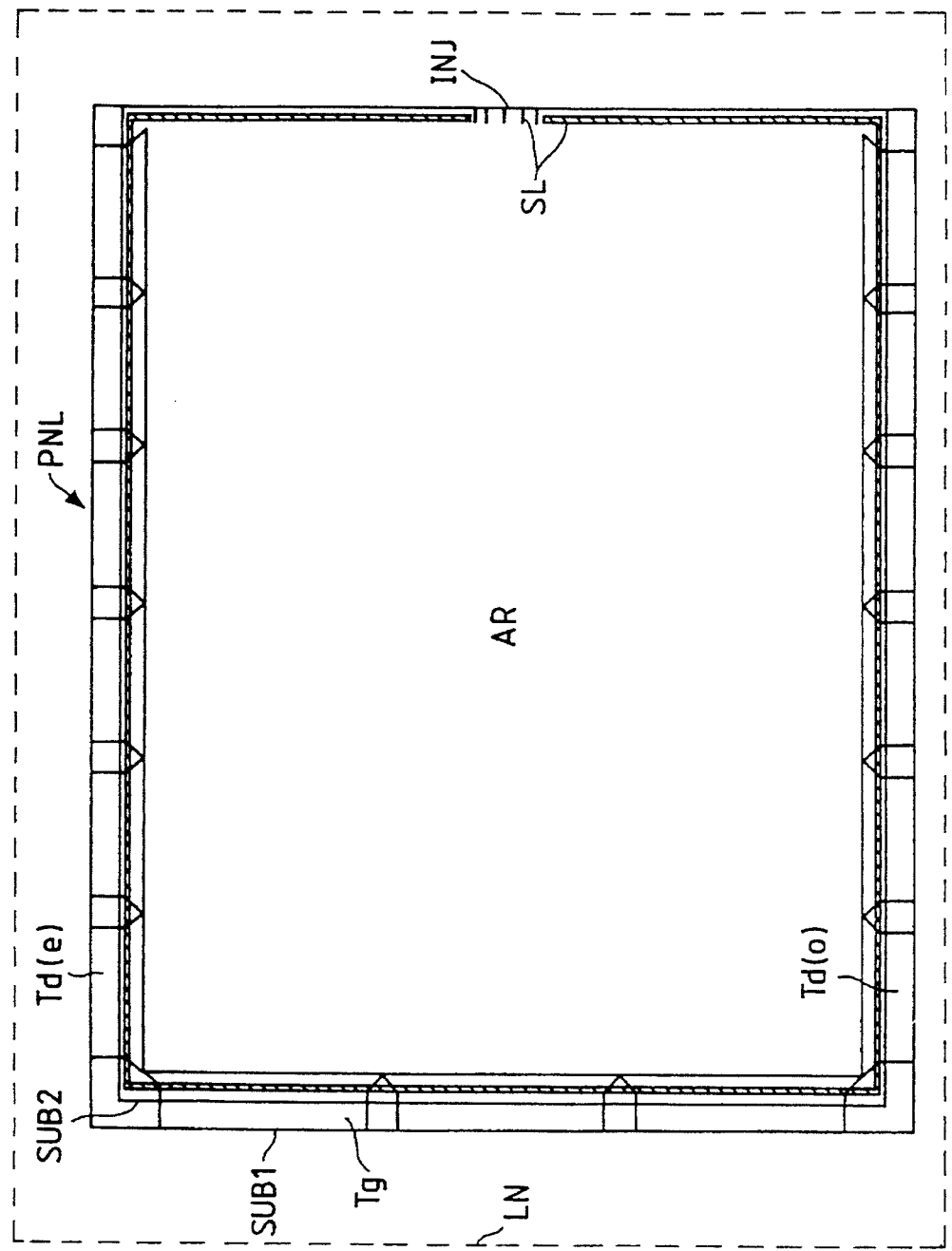
FIG. 7 is a plan view showing the constitution of the periphery of the matrix area of a display panel.
Figure 8:
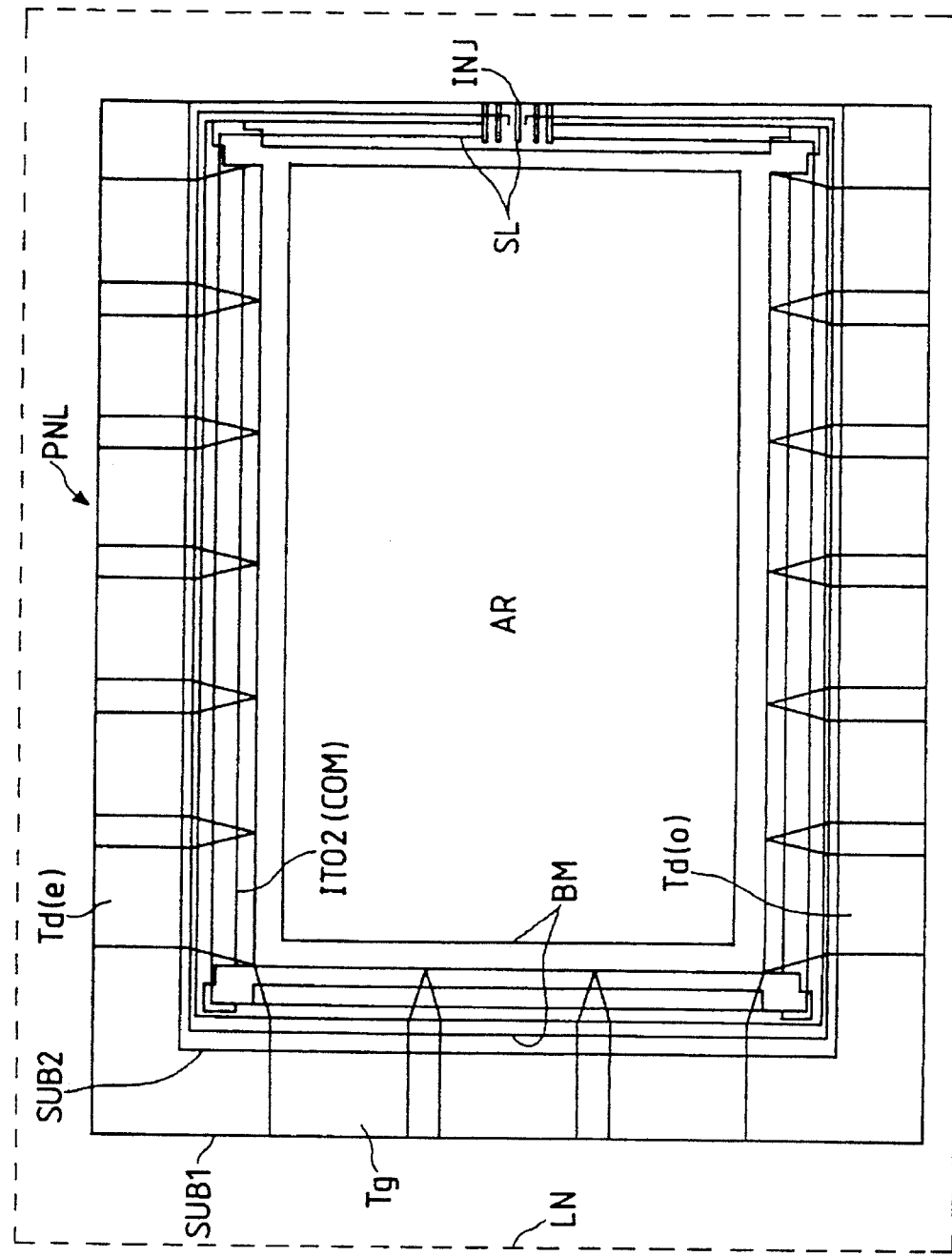
FIG. 8 is a plan view showing another constitution of the periphery of the matrix area of a display panel.
Figure 9:
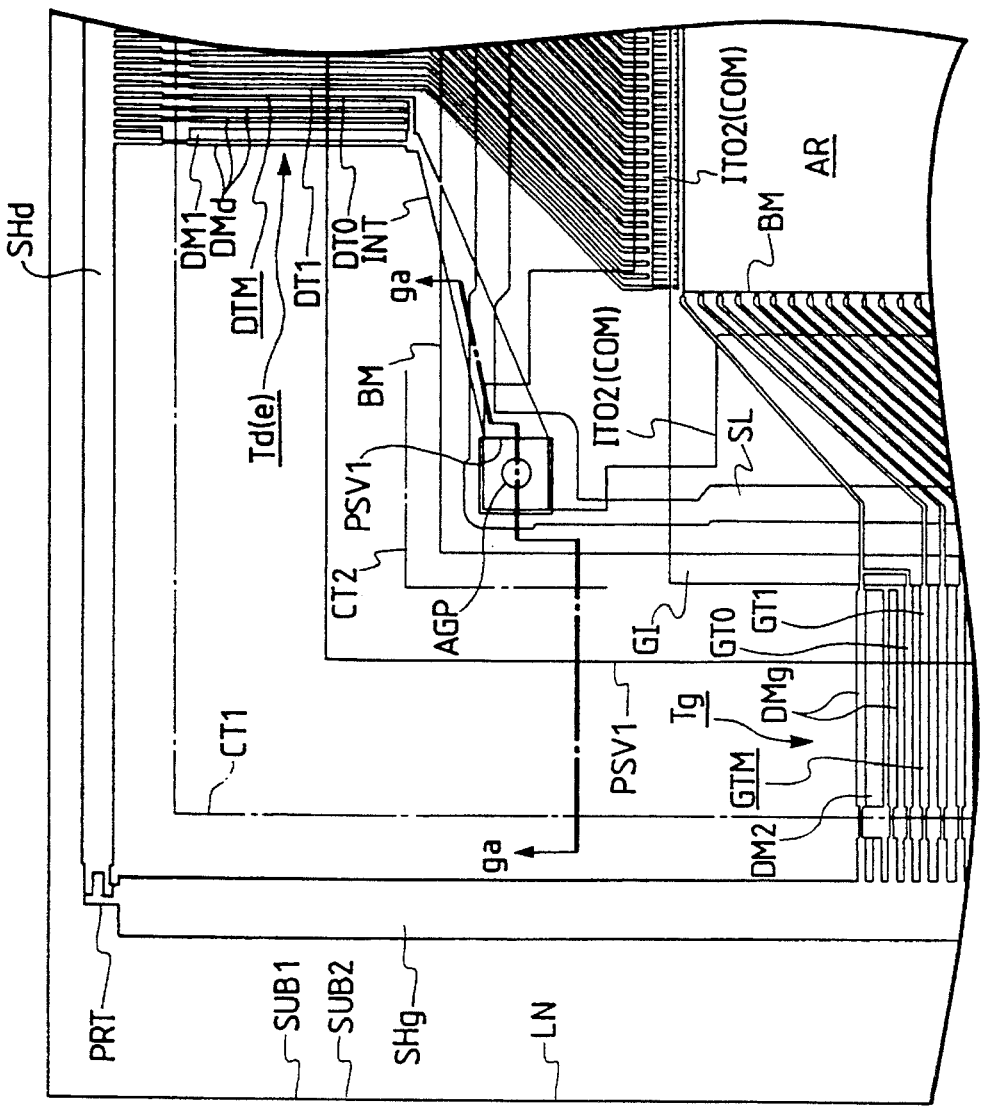
FIG. 9 is an enlarged plan view of an area in the corner of a display panel.

FIG. 7 is a plan view of an exemplary part of an area surrounding a matrix array AR of a display panel PNL including the glass substrates SUB1 and SUB2; FIG. 8 is an enlarged plan view similar to FIG. 7; FIG. 9 is an enlarged plan view of a part of an area in the vicinity of a sealing film SL in the upper left-hand corner of the display panel PNL shown in FIGS. 7 and 8; FIG. 10(a) is a sectional view taken on line 9a—9a in FIG. 9; FIG. 10(b) is a sectional view of the section shown in FIG. 3; FIG. 10(c) is a sectional view of an area in the vicinity of a data signal circuit connecting terminal DTM; FIG. 11(a) is a sectional view of an area in the vicinity of a gate circuit connecting terminal GTM to be connected to a gate circuit; and FIG. 11(b) is a sectional view of part of the sealing part, not provided with any external terminal.

When fabricating a comparatively small display panel having a construction as shown in FIG. 7, a plurality of sets of devices for a plurality of display panels are formed simultaneously on a single glass substrate, and then the glass substrate is cut into a plurality of display panels to improve the manufacturing throughput. When fabricating comparatively large display panels having a construction as shown in FIG. 7, devices are formed on a comparatively large standard glass substrate for forming any one of a plurality of different display panels having different sizes, and then the glass substrate is cut in a desired size to use a manufacturing facility for fabricating a plurality of kinds of display panels. FIGS. 7 to 9 show the latter display panel. FIGS. 7 and 8 shows a display panel obtained by cutting the lower glass substrate SUB1 and the upper glass substrate SUB2. FIG. 9 shows the display panel before the glass substrates SUB1 and SUB2 are cut. In FIG. 9, indicated at LN are the edges of the glass substrates SUB1 and SUB2, and at CT1 and CT2 are cutting lines. In either case, in the upper, lower and left sides of the display panel in which external terminal groups Tg and Td are formed, the edges of the upper glass substrate SUB2 are on the inside of the corresponding edges of the lower glass substrate SUB1 so that the external terminals of the external terminal groups Tg and Td are exposed. Indicated at Tg and Td are groups of the gate circuit connecting terminals GTM and the data signal circuit connecting terminals DTM, respectively, and the leads of those terminals for a tape carrier package TCP (FIGS. 40 and 41) which holds an IC chip CHI. The leads of the external terminal groups, extending from the matrix array to the external terminals, are sloped toward the opposite ends to arrange the terminals DTM and GTM of the display panel PNL at pitches corresponding to those of the packages TCP and the external terminals of the packages TCP.

A sealing film SL, such as an epoxy resin film, for sealing in a space between the transparent glass substrates SUB1 and SUB2 is formed between and along the edges of the transparent glass substrates SUB1 and SUB2, excluding a liquid crystal injecting opening INJ. The transparent common pixel electrode IT02 formed on the upper transparent glass substrate SUB2 is connected to leads INT formed on the lower transparent glass substrate SUB1 at least at one position (at four positions in the corners of the display panel in this embodiment) with a silver paste AGP. The leads INT are formed in a process of forming the gate circuit connecting terminals GTM and the data signal circuit connecting terminals DTM.

The orientation films ORI1 and ORI2, the transparent pixel electrodes ITO1 and the transparent common pixel electrode IT02 are formed on the inside of the sealing film SL. Polarizing plates POL1 and POL2 are attached to the outer surfaces of the lower transparent glass substrate SUB1 and the upper transparent glass substrate SUB2, respectively. The liquid crystal layer LC is sealed in a space between the lower orientation film ORI1 and the upper orientation film ORI2 sealed by the sealing film SL. The lower orientation film ORI1 is formed over a protective film PSV1 on the side of the lower transparent glass substrate SUB1.

When fabricating the liquid crystal display, the layers on the side of the lower transparent glass substrate SUB1 and the layers on the side of the upper transparent glass substrate SUB2 are formed separately; the sealing film SL is formed on the inner surface of the upper transparent glass substrate SUB2; the lower transparent glass substrate SUB1 and the upper transparent glass substrate SUB2 are put together; the liquid crystal is injected through the liquid crystal injecting opening INJ into the space between the transparent glass substrates SUB1 and SUB2 to form the liquid crystal layer LC; the liquid crystal injecting opening INJ is closed with an epoxy resin or the like; and then the transparent glass substrates SUB1 and SUB2 are cut in a desired size.

Thin-Film Transistor TFT

The structure formed on the lower transparent glass substrate SUB1 will be described in detail with reference to FIGS. 1 to 6. When a positive bias is applied to the gate line GL, the source-drain channel resistance decreases and the thin-film transistor TFT becomes conductive. When the positive bias is removed, the source-drain channel resistance increases and the thin-film transistor TFT becomes nonconductive.

Each pixel is provided with one thin-film transistor TFT formed on the gate line GL, as shown in FIG. 3. The gate electrode, i.e., the gate line GL, is coated with an anodic oxide film AOF formed by anodizing the gate line GL, and a silicon nitride insulating film GI. The anodic oxide film AOF and the silicon nitride insulating film GI form a gate insulating layer. An i-type semiconductor layer AS formed of i-type amorphous silicon (Si), i.e., intrinsic silicon not doped with any type determining impurity, a pair of source electrodes SD1 and a pair of drain electrodes SD2 are formed on the gate insulating layer. The source and the drain are identified by their bias polarities, and the bias polarities are inverted during the operation of the liquid crystal display. Accordingly, it is to be understood that the source and the drain alternate with each other during the operation of the liquid crystal display. However, in the following description, one of the layers will be constantly referred to as a source and the other will be constantly referred to as a drain as a matter of convenience.

Gate Electrode (Gate Line GL)

In this embodiment, a single-layer first conductive film g1 forms the gate lines GL. The first conductive film g1, for example, is a sputtered aluminum (Al) film. The first conductive film g1 is coated with the anodic oxide film AOF, i.e., an aluminum oxide film.

Insulating Film GI

An insulating film GI is used together with the anodic oxide film AOF as a gate insulating film to apply an electric field created by the gate line GL to the semiconductor layer AS in the thin-film transistor TFT. The insulating film GI, for example, is a silicon nitride film of a thickness in the range of 1200 to 2700-Å (in this embodiment, about 2000-Å) formed by plasma CVD. The insulating film GI is formed in areas corresponding to the thin-film transistor TFT, the additional capacitor Cadd, the source electrode SD1, the drain electrode SD2 and the data line DL. The insulating film GI is formed in a pattern having an isolated land corresponding to the additional capacitor Cadd, and extending along the drain electrode SD2 and the data lines DL, which is one of the features of the present invention. The gate lines GL are not coated entirely with the insulating film GI, and part of the insulating film GI, similarly to the semiconductor layer AS, is removed from the data lines DL adjacent to the additional capacitor Cadd. The source electrode SD1 is removed by patterning. Part of the gate line GL not coated with the insulating film GI is coated with the anodic oxide film AOF.

I-type Semiconductor layer AS

The i-type semiconductor layer AS is formed in areas corresponding to the thin-film transistor TFT, the additional capacitor Cadd, the source electrode SD1 and the drain electrode SD2 in a pattern having an isolated land corresponding to the additional capacitor Cadd and extending along the drain electrode SD2 and the data lines DL. The gate lines GL are not coated entirely with the semiconductor layer AS, and part of the semiconductor layer AS, similarly to the insulating film GI, is removed from the data lines DL adjacent to the additional capacitor Cadd and the source electrode SD1. The semiconductor layer AS is an amorphous silicon layer having a thickness in the range of 200 to 2200-Å (in this embodiment, about 2000-Å). An ohmic contact layer d0 is an n+-type amorphous silicon layer doped with phosphorus (P), and is formed so as to overlie only the i-type semiconductor layer AS and to underlie only a conductive layer d2 (d3).

Figure 18:
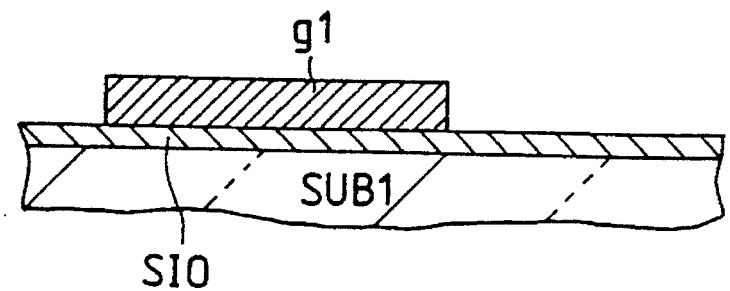
FIG. 18 is a sectional view of a pixel component formed on the lower transparent glass substrate SUB1 in a process A of the method shown in FIG. 17.

The i-type semiconductor layer AS is formed to separate the gate lines and the data lines at their intersections and to separate the gate lines, and the source electrode SD1, the drain electrode SD2 and the additional capacitor Cadd at their intersections for insulation together with the anodic oxide film AOF and the insulating film GI to prevent short-circuiting. The n+-type amorphous silicon layer d0, the i-type semiconductor layer AS and the insulating film GI are formed in an area under the source electrode SD1 and over the transparent pixel electrode ITO1 (d1), which is one of the features of the present invention. This feature prevents the breakage of the source electrode SD1 connected to the transparent pixel electrode ITO1 (d1) as shown in FIG. 18. Even if the source electrode SD1 and the drain electrode SD2 are not patterned correctly and even if the source electrode SD1 and the drain electrode SD2 remain only over the anodic oxide film AOF on the gate lines GL, the anodic oxide film AOF has a sufficient dielectric strength to prevent short circuits, which is one of the features of the present invention.

In this embodiment, the semiconductor layer AS and the insulating film GI underlying the data lines DL extend over the transparent pixel electrode ITO1 and insulate the data lines DL and the transparent pixel electrode ITO1 from each other, which also is one of the features of the present invention. Accordingly, even if the data lines DL and the transparent pixel electrode ITO1 are arranged close to each other to provide a bright liquid crystal display having a large numerical aperture, a short circuit between the data lines DL and the transparent pixel electrode ITO1 (d1) can be prevented.

Since a single photoresist pattern is used for forming both the semiconductor layer AS and the insulating film GI, the number of photolithographic etching processes for forming the semiconductor layer AS and the insulating film GI in this embodiment is smaller than that of the photolithographic etching processes in which different photoresist patterns are used respectively for forming the semiconductor layer AS and the insulating film GI. The probability of a short circuit between the data lines and the transparent pixel electrode ITO1 (d1) when both the semiconductor layer AS and the insulating film GI are used for insulating the data lines DL and the transparent pixel electrode ITO1 (d1) from each other is lower than that when only the insulating film GI is used for the same purpose, because the dielectric strength of the insulating film GI is reduced due to the insufficient selection ratio of the insulating film GI during the etching of the semiconductor layer AS when the semiconductor layer AS and the insulating film GI are processed by separate photolithographic etching processes and the i-type semiconductor layer AS underlying the data lines DL is not formed over the transparent pixel electrode ITO1 (d1).

Transparent Pixel Electrode ITO1

The transparent pixel electrode ITO1 is one of the pixel electrodes of the liquid crystal display panel. The transparent pixel electrode ITO1 is connected to the source electrode SD1 of the thin-film transistor TFT, as shown if FIG. 3. The first conductive film d1 forms the transparent pixel electrode ITO1. The first conductive film d1 is a transparent conductive film of ITO (indium tin oxide), i.e., NESA film, having a thickness in the range of 100 to 2000-Å (in this embodiment, about 1400-Å).

Source Electrode SD1 and Drain electrode SD2

Each of the source electrode SD1 and the drain electrode SD2 consists of a second conductive film d2 in contact with the n+-type semiconductor layer d0, and a third conductive film d3 overlying the second conductive film d2.

The second conductive film d2 is a chromium (Cr) film formed by sputtering and having a thickness in the range of 500 to 1000-Å (in this embodiment, about 600-Å). The Cr film adheres firmly to the n+-type semiconductor layer d0 and serves as a barrier layer to prevent the diffusion of the third conductive film d3, i.e., an Al film, into the n+-type semiconductor layer d0. A film of a metal having a high melting point, such as Mo, Ti, Ta or W, or a film of a metal silicide having a high melting point, such as MoSi2, TiSi2, TaSi2 or WSi2, may be used instead of the Cr film as the second conductive film d2.

The third conductive film d3 is an Al film formed by sputtering and having a thickness in the range of 3000 to 500-Å (in this embodiment, about 4000-Å) by sputtering. The stress induced in the Al film is smaller than that induced in a Cr film, and also the Al film can be formed in a comparatively large thickness, is suitable for forming the source electrode SD1, the drain electrode SD2 and the data lines DL having a comparatively low resistance, and is capable of being formed in a high step coverage in covering stepped parts formed by the gate lines GL.

Although each of the source electrode SD1 and the drain electrode SD2 in this embodiment has a laminated structure consisting of the second conductive film d2 and the third conductive film d3, the third conductive film d3 may be omitted and each of the source electrode SD1 and the drain electrode SD2 may be formed of only the second conductive film d2 of Cr or a metal having a high melting point. When only the second conductive film is used, the thickness of the second conductive film must be on the order of 1800-Å.

After patterning the second conductive film d2 and the third conductive film d3 by using a single masking pattern, portions of the n+-type semiconductor layer d0 remaining over the i-type semiconductor layer AS are removed by using the same masking pattern or by using the second conductive film d2 and the third conductive film d3 as a mask. Although the surface of the i-type semiconductor layer AS is etched slightly in completely removing the portions of the n+-type semiconductor layer d0 by etching, the degree of etching of the surface of the i-type semiconductor layer AS may be adjusted by properly determining the etching time.

Data Lines DL

The data lines DL are formed by patterning the second conductive film d2 and the third conductive film d3 forming the source electrode SD1 and the drain electrode SD2. The data lines may be formed only of the second conductive film d2.

Protective Film PSV1

The thin-film transistor TFT and the transparent pixel electrode ITO1 are covered with a highly transparent, moisture-resistant protective film PSV1 principally for protecting the thin-film transistor TFT from moisture. The protective film PSV1 is a silicon dioxide film or a silicon nitride film formed by plasma CVD and having a thickness on the order of 1 μm. Generally, the protective film is formed by a vacuum apparatus, such as a plasma CVD apparatus, which improves the throughput as compared with a protective film formed of an organic material, such as an epoxy resin.

As shown in FIG. 9, the protective film PSV1 is formed so as to surround the matrix array AR entirely so that the external terminals DTM and GTM to be connected to external circuits are exposed partially or entirely, and leads INT of the lower transparent glass substrate SUB1 to be connected to the transparent common pixel electrode COM of the upper transparent glass substrate SUB2 with a silver paste AGP are exposed.

Shading Film BM

The shading film BM is formed on the upper transparent glass substrate SUB2 to shade the i-type semiconductor layer AS from external light or backlight. The inner side of a closed polygonal contour of the shading film BM shown in FIG. 1 is an opening in which the shading film BM is not formed. The shading film BM is a film having a high light intercepting property, such as an Al film or a Cr film. In this embodiment, the shading film BM is a Cr film of about 1300-Å in thickness formed by sputtering.

Thus, the channel region of the i-type semiconductor layer AS extending between the source electrode SD1 and the drain electrode SD2 of the thin-film transistor TFT is sandwiched between the shading film BM and the comparatively large gate line GL, so that the channel region is shaded from external light or backlight. The shading film BM is formed in a grid pattern, i.e., a black matrix, so as to surround the pixels to define the effective display area of each pixel. Since the contour of each pixel is defined by the shading film BM, a picture can be displayed in a high contrast. Thus, the shading film BM serves as both a shading film for shading the i-type semiconductor layer AS and a black matrix. Since the edge of the base end of the transparent pixel electrode ITO1 with respect to the rubbing direction, i.e., part of the transparent pixel electrode ITO1 in the lower right-hand corner of FIG. 1, is shaded by the shading film BM, the displaying characteristics of the liquid crystal display does not deteriorate even if a domain is formed in the edge, because the domain is hidden.

As shown in FIGS. 10(a), 10(b) and 10(c), the shading film BM is formed in the shape of a frame along the periphery and has a pattern corresponding to the pattern of the matrix array having a plurality of openings, i.e., dots, as shown in FIG. 1. As shown in FIGS. 7 to 10(c), the peripheral part of the shading film BM extends outward beyond the sealing film SL to shield the matrix array from leakage light, such as reflected light reflected by an apparatus, such as a personal computer, into which the liquid crystal display is incorporated. On the other hand, the shading film BM is formed so that the periphery thereof is about 0.3 to 1 mm on the inside of the edges of the substrate SUB2 and is separated from the cutting lines of the substrate SUB2.

Figure 32:
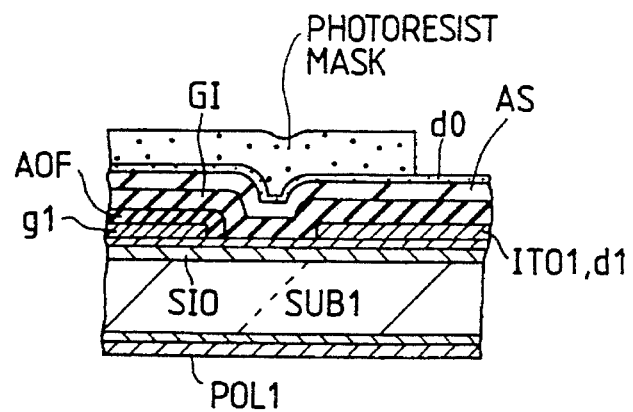
FIG. 32 is a sectional view of the lower transparent glass substrate SUB1 and a structure formed thereon.
Figure 33:
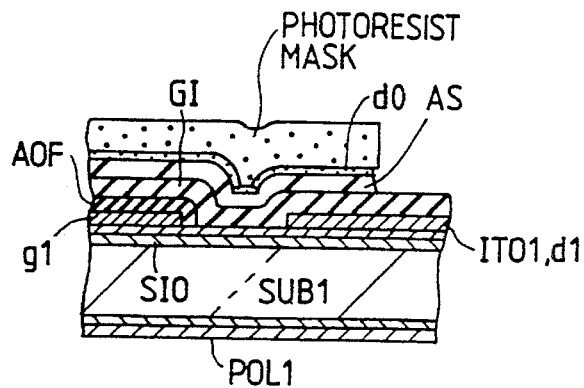
FIG. 33 is a sectional view of the lower transparent glass substrate SUB1 and a structure formed thereon.
Figure 34:
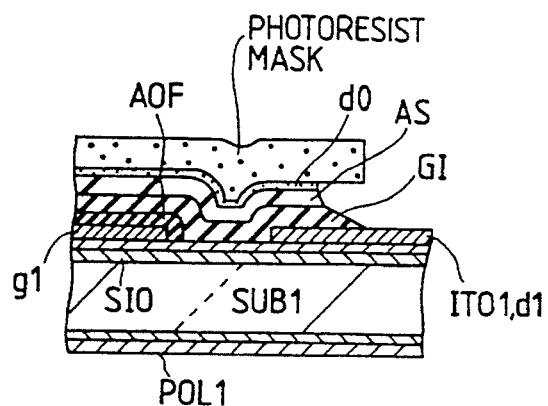
FIG. 34 is a sectional view of the lower transparent glass substrate SUB1 and a structure formed thereon.
Figure 36:
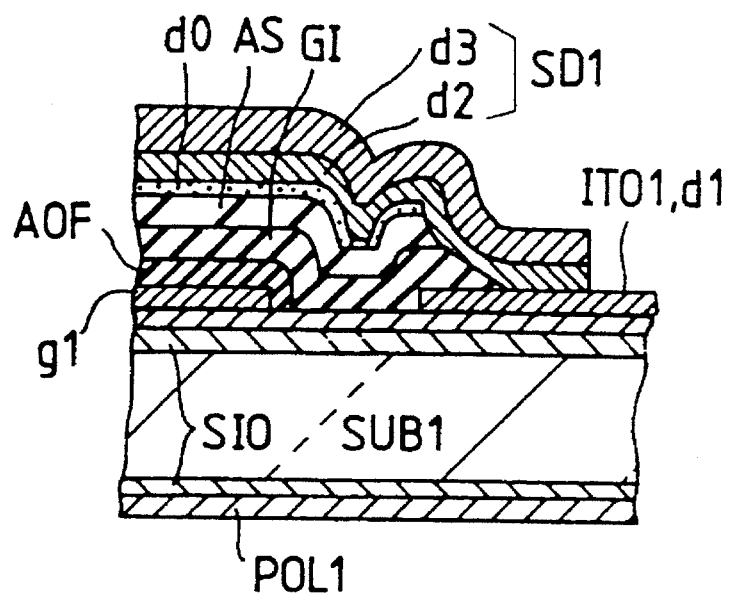
FIG. 36 is a sectional view of a source electrode.

As is apparent from the sectional views taken in FIG. 1, the i-type semiconductor layer AS and the insulating film GI are formed in the same pattern. However, in a practical liquid crystal display, the i-type semiconductor layer AS and the insulating film GI are formed in different patterns, and the insulating film GI is formed so as to extend beyond the periphery of the i-type semiconductor layer AS and to surround the i-type semiconductor layer AS in a plane as shown in FIG. 36. Such a pattern of the insulating film GI is important to connect the source electrode SD1 to the transparent pixel electrode ITO1 (d1) without fail, which is one of the features of the present invention. In the following description, the patterns of thin films excluding those shown in FIGS. 32 to 34 are regarded as the same as the patterns of photomasks for convenience' sake.

Figure 4:
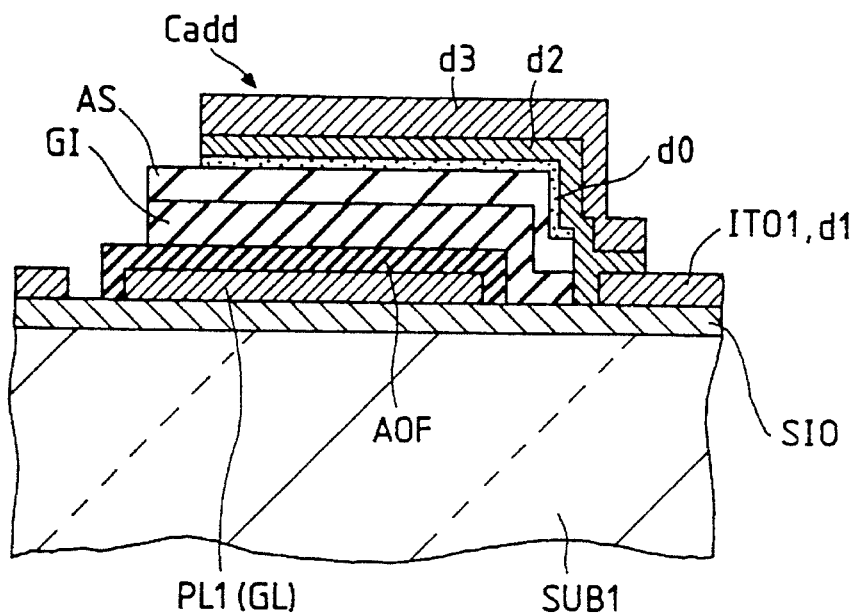
FIG. 4 is a sectional view taken on line 4—4 in FIG. 1.

As shown in FIG. 1, the i-type semiconductor layer AS and the insulating film GI are formed in the same pattern. A laminate structure of the n+-type semiconductor layer d0, the i-type semiconductor layer AS and the insulating film GI is formed under the drain electrode SD2, and the anodic oxide film AOF is formed in a self-aligned state over the gate line GL. This laminated structure prevents a short circuit between the gate line GL and the data line DL, which forms a cross-shaped linear defect in the picture. The additional capacitor Cadd has a similar sectional construction. The probability of a short circuit between the upper electrodes d3 and d2, and the gate line GL causing point defects can be remarkably reduced. As shown in FIG. 4, the additional capacitor Cadd has the upper electrodes d2 and d3 thereof connected to the transparent pixel electrode ITO1 (d1), the lower electrode formed by part of the gate line GL, and a dielectric layer consisting of the anodic oxide film AOF, i.e., an Al oxide film, the insulating film GI of silicon nitride and the i-type semiconductor layer AS, formed between the upper and lower electrodes. Parts of the i-type semiconductor layer AS and the insulating film GI underlying the drain electrode SD2, and parts of the i-type semiconductor layer AS and the insulating film GI underlying the additional capacitor Cadd are formed in isolated islands to prevent a malfunction which occurs when the i-type semiconductor layer AS is continuous. Even if the electrode layers d2 and d3 of the drain electrode SD2 are not etched correctly and part of the same remains between the additional capacitor Cadd and the drain electrode SD2 (FIG. 1), the anodic oxide film AOF prevents a short circuit between the drain electrode SD2 and the gate line GL.

Figure 2:
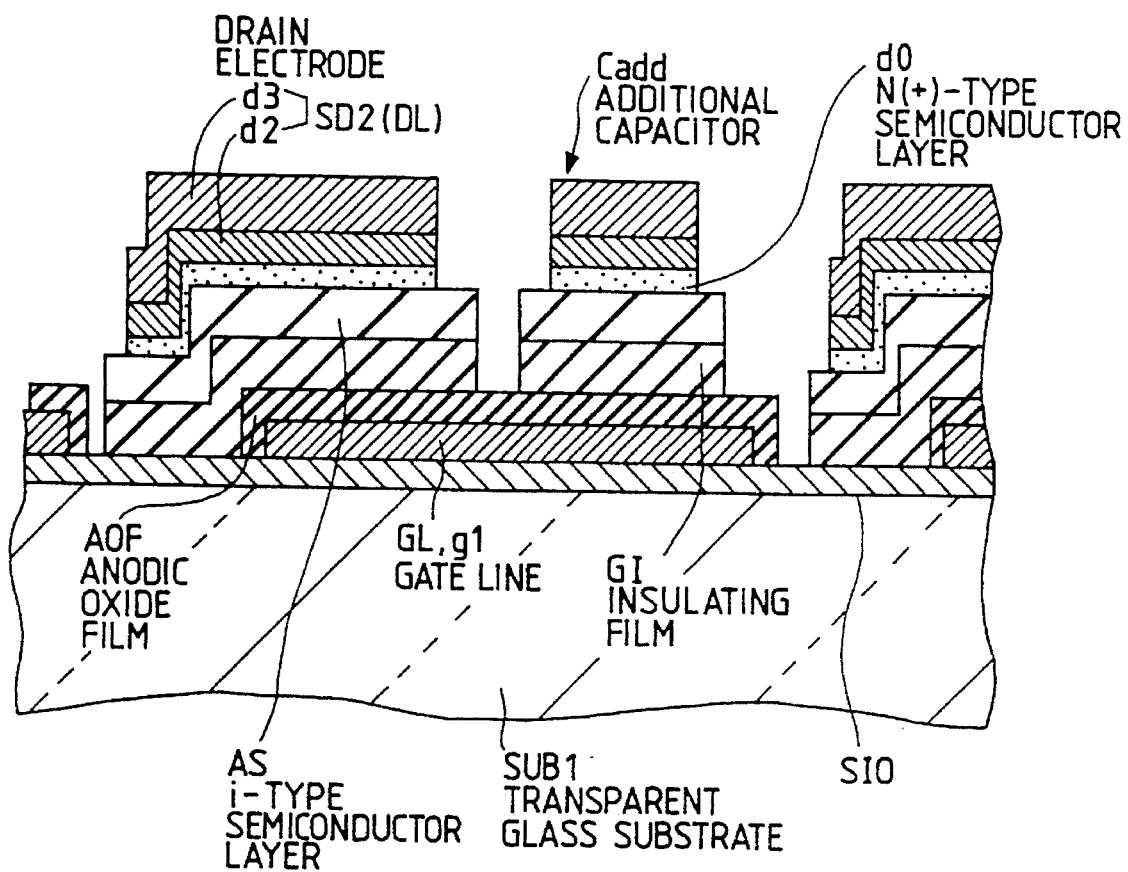
FIG. 2 is a sectional view taken on line 2—2 in FIG. 1.
Figure 5:
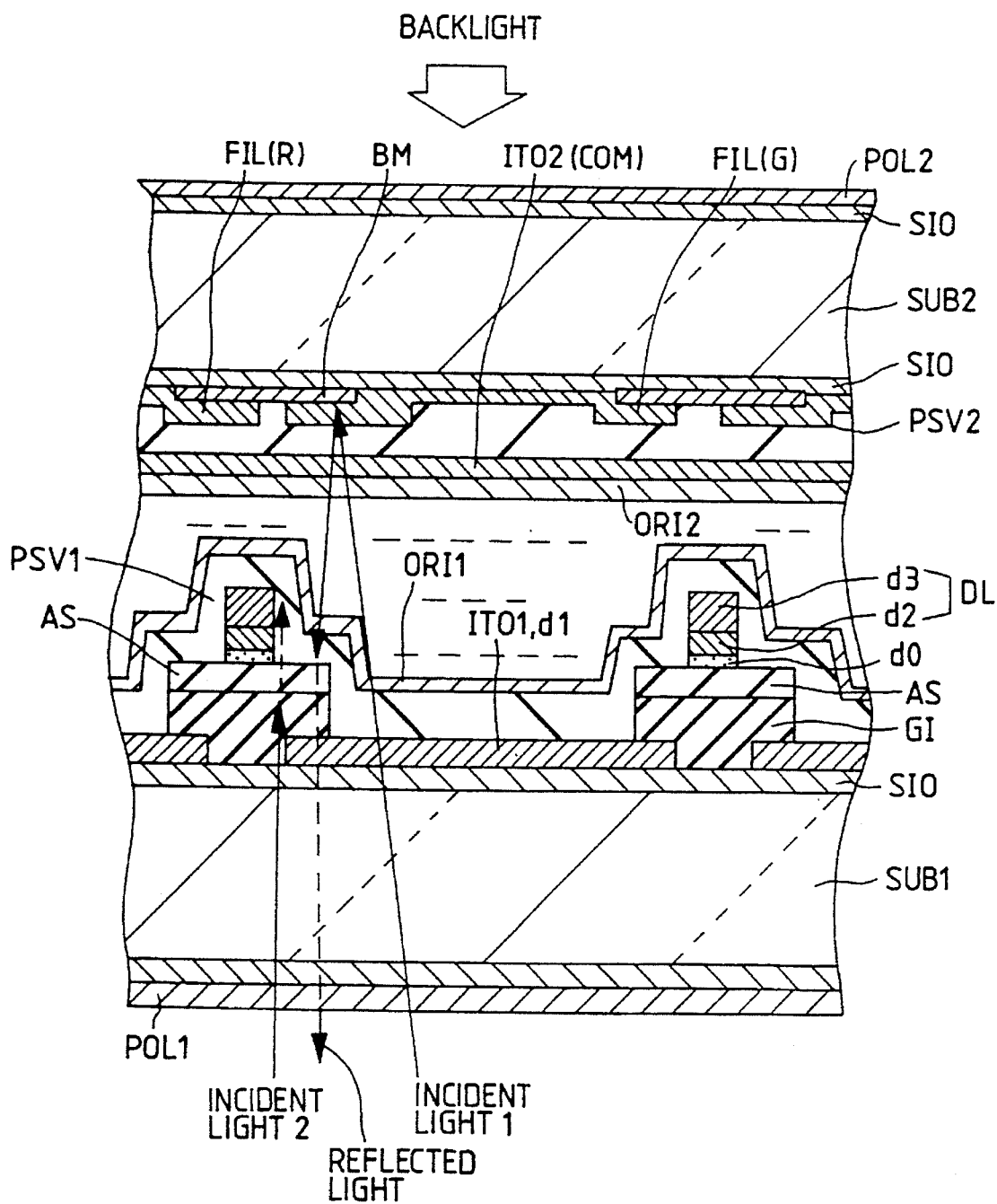
FIG. 5 is a sectional view taken on line 5—5 in FIG. 1.

A most important feature of the present invention will be described hereinafter with reference to FIGS. 1, 5 and 6. As shown in FIG. 1, the i-type semiconductor layer AS and the insulating film GI are formed under the data lines DL, the drain electrode SD2, the source electrode SD1 and the upper electrode layers d3 and d2 of the additional capacitor Cadd. Particularly, parts of the i-type semiconductor layer AS and the insulating film GI corresponding to the drain electrode SD2, the source electrode SD1 and the data lines DL are formed in isolated islands. Parts of the i-type semiconductor layer AS and the insulating film GI corresponding to the data line DL are formed along the data line DL so as to interconnect the adjacent gate lines GL. The i-type semiconductor layer AS and the insulating film GI are not formed along the width of the data line DL. However, the patterns of the i-type semiconductor layer AS and the insulating film GI have contour lines extending across the gate lines GL, as shown in FIGS. 1 and 2. Furthermore, the contour lines of the i-type semiconductor layer AS and the insulating film GI extend in an area between the lower part of the data line to an area over the pixel electrode.

Figure 6:
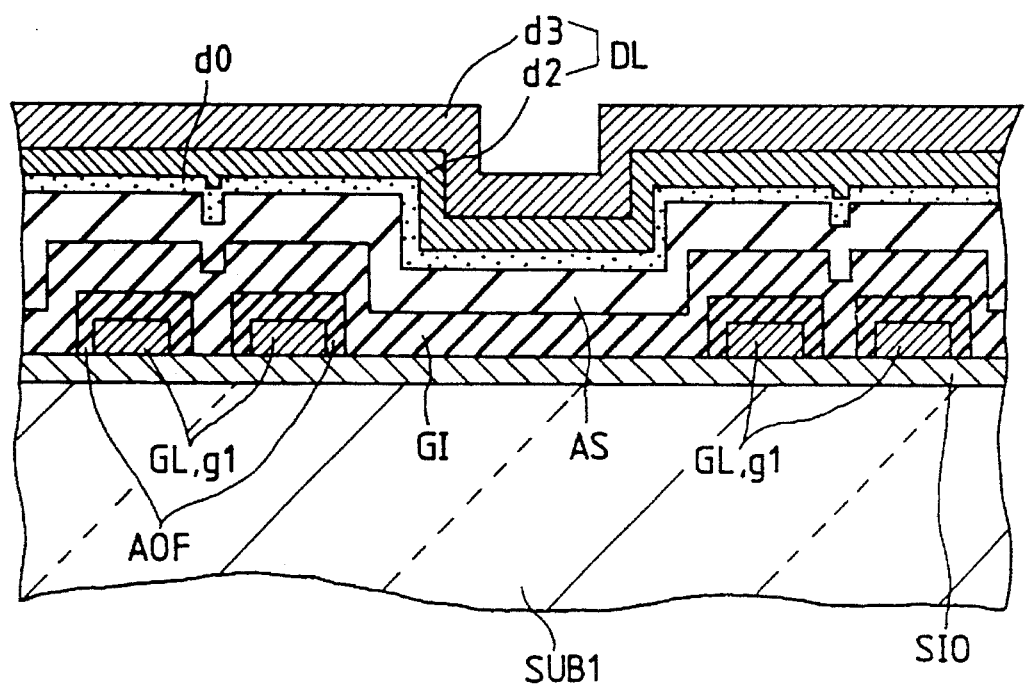
FIG. 6 is a sectional view taken on line 6—6 in FIG. 1.

As shown in FIG. 6, the anodic oxide film AOF is formed in a self-aligned state over the upper surface and the side surfaces of the gate lines at least in the display area excluding a terminal area, and the anodic oxide film AOF does not extend across the gate line GL.

Effects of the features of this construction will be described hereinafter. Referring to FIG. 5 showing a section taken on line 5—5 in FIG. 1 showing two adjacent data lines DL, the n+-type semiconductor layer d0, the i-type semiconductor layer AS and the insulating film GI are formed under the data line DL, and the i-type semiconductor layer AS and the insulating film GI are formed over the transparent pixel electrode ITO1 (d1). In this construction, the data lines DL and the transparent pixel electrode d1 are isolated from each other by the i-type semiconductor layer AS and the insulating film GI, and hence the interval between the pixel electrodes d1 formed on the opposite sides of the data line DL may be small. Accordingly, a bright liquid crystal display having a large numerical aperture can be formed. Even if the data line DL is not etched correctly and, for example, the data line DL is formed in a width wider than a desired width, the probability of a short circuit between the data line DL and the transparent pixel electrode ITO1 (d1) can be reduced. This effect in preventing a short circuit may be produced by forming the n+-type semiconductor layer d0 and the i-type semiconductor layer AS at intervals which are substantially the same as those of the data lines DL and forming only the insulating film GI over the transparent pixel electrode ITO1 through an increased number of photolithographic etching processes. However, in such a case, since the selection ratio between the i-type semiconductor layer AS and the insulating film GI is a small value in the range of three to four, the thickness of the insulating film GI is reduced to cause significant etching damage. Consequently, if the data lines DL are not perfectly etched, the dielectric strength of the data lines DL and the transparent pixel electrode ITO1 (d1) is reduced and a desired short circuit preventing effect (point defect reducing effect) cannot be obtained.

The relation between the construction shown in FIG. 5 and the picture quality will be described hereinafter. In FIG. 5, backlight falls on the outer surface of the upper transparent glass substrate SUB2, and a picture formed by the liquid crystal layer LC is viewed through the outer surface of the lower transparent glass substrate SUB1. The liquid crystal employed in this liquid crystal display darkens when a voltage is applied thereto and the liquid crystal display is of a normally white mode type. When the ambient illuminance is low, i.e., when the ambience is dark and the ambient illuminance is 100 lx or below, the backlight travels through the openings of the shading film BM formed on the upper transparent glass substrate SUB2 to enable a recognition of the picture. When the liquid crystal darkens, the picture is displayed in black by the shutter effect of the liquid crystal filling up the space between the transparent pixel electrode of the lower transparent glass substrate SUB1 and the second transparent electrode ITO2 of the upper transparent glass substrate SUB2. In this case, the intensity of light penetrating the lower transparent glass substrate SUB1 is low and a black picture is displayed clearly. When the ambient illuminance is high, external incident light 1 and external incident light 2 fall on the liquid crystal display. Since the i-type semiconductor layer AS underlying the data line DL extends over the transparent pixel electrode ITO1 (d1), the external incident light 2, which will travel through the space and will be reflected by the shading film BM of the upper transparent glass substrate SUB2 if the i-type semiconductor layer AS is not formed between the transparent pixel electrode ITO1 and the data line DL, is absorbed by the i-type semiconductor layer AS so that a black picture is displayed with a high contrast, which improves picture quality.

As shown in FIG. 6, showing a section taken on line 6—6 in FIG. 6, the n+-type semiconductor layer d0, the i-type semiconductor layer AS and the insulating film GI are formed under the data line DL. Therefore, steps are formed only by the gate lines GL and the anodic oxide film AOF, and the number of steps which are to be covered by the data lines DL in this construction is smaller than that in a construction in which the lands of the i-type semiconductor layer AS are formed only at the intersections of the gate lines GL and the data lines DL, so that the probability of breakage of the data lines DL is reduced. Since the n+-type semiconductor layer d0 and the conductive layer d2 made of a metal having a high melting point (in this embodiment, Cr) form a metal silicide, the adhesion of the data lines DL is enhanced, which further reduces the probability of breakage of the data lines DL. This short circuit preventing effect may be produced, for example, by forming the n+-type semiconductor layer d0 and the i-type semiconductor layer AS at intervals which are substantially the same as those of the data lines DL, processing only the insulating film GI by a photolithographic etching process and forming the data lines over the insulating film GI through an increased number of photolithographic etching processes. However, the inventors found through experiments that this effect is not necessarily sufficient. The analysis of the causes of defects due to the breakage of the data lines DL of a liquid crystal display fabricated by processing an n+-type semiconductor layer and an i-type semiconductor layer AS underlying data lines DL by a photolithographic etching process, and processing an insulating film GI by another photolithographic etching process, showed that 10% of the defects were caused by steps in the gate lines GL, 30% of the defects were caused by the residual resist remaining after forming the n+-type semiconductor layer and the i-type semiconductor layer AS, 40% of the defects were caused by the residual resist remaining after forming the insulating film GI, and 20% of the defects were caused by defects in the resist used for forming the data lines DL. The number of defects caused by the residual resist remaining after forming the insulating film GI is greater than that of the defects caused by the residual resist remaining after forming the n+-type semiconductor layer and the i-type semiconductor layer AS because the insulating film GI was formed after the n+-type semiconductor layer and the i-type semiconductor layer AS, and foreign matter and the like accumulated in the preceding processes caused more defects in the process of forming the insulating film GI. The percentage defective of the liquid crystal display of the present invention was less than that of the conventional liquid crystal display by 40% which corresponds to the percentage defect of 40% attributable to the insulating film GI.

Color Filter FIL

The color filter FIL has red stripes, green stripes and blue stripes arranged in rotation at positions corresponding to the pixels. The color filter FIL is formed so as to cover the transparent pixel electrode ITO1 entirely, and the shading film BM is formed on the inside of the periphery of the transparent pixel electrode ITO1 so as to overlap the edges of the color filter FIL and the transparent pixel electrode ITO1.

When forming the color filter FIL, first a coloring base film of an acrylic resin or the like is formed over one of the major surfaces of the upper transparent glass substrate SUB2. Then, portions of the coloring base film are dyed in red and the dye is fixed to form red stripes R, and then the same process is repeated and a green dye and a blue dye are used to form green stripes G and the blue stripes B.

Protective Film PSV2

The protective film PSV2 prevents the diffusion of the dyes of the color filter FIL into the liquid crystal layer LC. The protective film PSV2 is formed of a transparent resin, such as an acrylic resin or an epoxy resin.

Common Transparent Pixel Electrode ITO2

The transparent common pixel electrode ITO2 is disposed opposite to the transparent pixel electrodes ITO1 formed on the lower transparent glass substrate SUB1 so as to correspond respectively to the pixels. The optical condition of a portion of the liquid crystal layer LC changes according to the potential difference (electric field) between the corresponding transparent pixel electrode ITO1 and the transparent common pixel electrode IT02. A common voltage Vcom is applied to the transparent common pixel electrode IT02. In this embodiment, the common voltage Vcom is the middle dc voltage between a lowest driving voltage Vdmin and a highest driving voltage Vdmax applied to the data lines DL. If it is desired to reduce the supply voltage applied to the integrated circuit of a data line driving circuit by about half, an ac voltage is applied to the transparent common pixel electrode IT02. FIGS. 8 and 9 show the shape of the transparent common pixel electrode IT02 in plan views.

Construction of the Additional Capacitor Cadd

The transparent pixel electrode ITO1 has one end connected to the thin-film transistor TFT and the other end overlapping the adjacent gate line GL. As is apparent from FIG. 4, the thus overlapping end of the transparent pixel electrode ITO1 and the adjacent gate line GL form the additional capacitor Cadd having an electrode PL2 of a laminated construction consisting of the second conductive film d2 and the third conductive film d3 forming the source electrode SD1 connected to the transparent pixel electrode ITO1, and the drain electrode SD2, and another electrode PL1 which is a part of the adjacent gate line GL. The anodic oxide film AOF serving as the gate insulating film of the thin-film transistor TFT, the insulating film GI, the i-type semiconductor layer AS and the n+-type semiconductor layer d0 serve as the dielectric film of the additional capacitor Cadd, which is an important feature of this embodiment; that is, the anodic oxide film AOF, the insulating film GI, the i-type semiconductor layer AS and the n+-type semiconductor layer d0 are superposed at the intersection of the gate electrode GT (gate line GL) and the drain electrode SD2, at the intersections of the gate lines GL and the data lines DL, at the intersection of the gate line GL and the source electrode, and between the electrodes of the additional capacitor Cadd. Since the insulating film GI, the i-type semiconductor layer AS and the n+-type semiconductor layer d0 formed successively by plasma CVD processes between the electrodes of the additional capacitor are not removed by etching, defects causing short circuits (point defects) are reduced.

Gate Circuit Connecting Terminal Arrangement

FIG. 12 is a plan view of a connecting structure for connecting the gate lines of the display matrix array to gate circuit connecting terminals GTM, and FIG. 13 is a sectional view taken on line B—B in FIG. 12. The part shown in FIGS. 12 and 13 corresponds to the lower part of FIG. 9, and actually bent lines are represented by a straight line for convenience sake. Indicated at AO is a pattern of a resist film for selective anodic oxidation. The resist film is removed after selective anodic oxidation and the pattern AO remains in the liquid crystal display. The anodic oxide film AOF is formed on the gate lines GL in the same pattern as the pattern AO as shown in FIG. 13. As shown in FIG. 12, an area on the left side of the edge of the pattern AO is not covered with the resist film and is not subjected to anodic oxidation, and the area on the right side of the edge of the pattern AO is exposed to anodic oxidation. The resist film is formed in the pattern AO by drawing the pattern AO of a negative resist with a nozzle and heating the pattern AO of the negative resist. This resist film forming process is more simple than a photoresist film forming process including steps of applying a photoresist to the work, developing the photoresist in a desired pattern and heating the developed photoresist, so that the throughput of the process is improved. The photoresist film forming process is capable of forming a minute pattern of a photoresist film with a high accuracy.

When the Al layer g1 is subjected to anodic oxidation, the anodic oxide film AOF, i.e., Al2O3 film, is formed in the surface and the volume of the conductive part of the Al layer g1 is reduced. Naturally, the conditions including the time and the voltage for anodic oxidation are regulated properly so that the Al layer g1 may not be anodized entirely.

The gate circuit connecting terminals GTM are formed of the Al layer g1 and the transparent conductive layer d1 is formed simultaneously with the transparent pixel electrodes ITO1 in the same layer and coats the Al layer g1. Since the contact resistance between the Al layer g1 and the transparent conductive film d1 is high, the laminated structure of the Al layer g1 and the transparent conductive film d1 cannot be used for forming terminals. Therefore, the transparent conductive film d1 is partly removed in the vicinity of the boundary between the protective film PSV1 and the anodic oxide film to connect the Al layer g1 forming the gate lines GL directly to the second conductive film d2 of Cr and the third conductive film d3 of Al. Parts of the second conductive film d2 and the third conductive film d3 on the left side of the area in which the Al layer g1 is connected directly to the second conductive film d2 and the third conductive film d3 overlie the transparent conductive film d1. This structure is effective because the contact resistance between the second conductive film d2 of Cr and the transparent conductive film d1 and the contact resistance between the second conductive film d2 of Cr and the Al film g1 forming the gate lines GL are comparatively small. Since the third conductive film d3 is an Al film, the contact resistance between the second conductive film d2 and the third conductive film d3 is comparatively small. Since the second conductive film d2 is comparatively thin, the second conductive film d2 secures coverage when breakage occurs at the step of the transparent conductive film d1. Accordingly, signals are transmitted from the gate circuit connecting terminals GTM to the gate lines GL through the transparent conductive film d1, the second conductive film d2 of Cr. the third conductive film d3 of Al, the second conductive film d2 and the Al layer g1 forming the gate lines GL. In a plan view, in the gate electrode GTM, the insulating film GI, the i-type semiconductor layer AS, the n+-type semiconductor layer d0 and the protective film PSV1 have shapes having a through hole; that is, the pattern of the Al layer g1 is smaller than that of the transparent conductive film d1, and the step formed in the Al layer g1 is covered with the i-type semiconductor layer AS and the insulating film GI. This construction prevents the etching of the Al layer g1 with a chemical or the like due to the inferior coverage when the transparent conductive film d1 is thinner than the Al layer g1. The insulating film GI, the i-type semiconductor layer AS and the n+-type semiconductor layer d0 are formed in patterns so that the second conductive film d2 and the third conductive film d3 overlapping the same can be connected to the transparent conductive film d1. The protective film PSV1 is formed so as to cover the second conductive film d2 and the third conductive film d3 for protection. These patterns reduce the contact resistance of the gate circuit connecting terminals GTM having the foregoing transmission passage remarkably even if the contact resistance between the transparent conductive film d1 and the Al layer g1 is comparatively high. Since only the protective film PSV1 and the transparent conductive film d1 are exposed in this structure, this structure is highly resistant to corrosion and has a high reliability.

The gate circuit connecting terminals GTM are connected electrically via through holes to an external circuit. Only one set of the gate line GL and the gate circuit connecting terminal is shown in FIGS. 12 and 13. Practically, the liquid crystal display is provided with terminal groups Tg (FIGS. 7, 8 and 9) each having a plurality of sets each including the gate line GL and the gate circuit connecting terminal. The gate circuit connecting terminals are extended outside beyond cutting lines CT1 along which the substrates are trimmed, and the extremities of the gate circuit connecting terminals are joined to short-circuiting lines SHg. The short-circuiting lines SHg are used for feeding power for anodic oxidation and for preventing electrostatic destruction when rubbing the orientation film ORI1.

Data Signal Circuit Connecting Terminals DTM

FIG. 14 is a plan view showing the connection of the data line DL and the data signal circuit connecting terminal DTM, and FIG. 15 is a sectional view taken on line B—B in FIG. 14. FIGS. 14 and 15 show an area in the upper right-hand corner of FIG. 8. FIGS. 14 and 15 show the components with an orientation different from that of the components in FIG. 8 for convenience' sake. The right-hand area in FIGS. 14 and 15 corresponds to the upper end (or the lower end) of the lower transparent glass substrate SUB1.

No external circuit is connected to an inspection terminal TSTd, which is formed in a width wider than that of the wiring line to facilitate bringing a probe or the line into contact with it. The plurality of inspection terminals TSTd and the plurality of data signal circuit connecting terminals DTM are arranged vertically and alternately in a staggered arrangement. The inspection terminals TSTd terminate inside the edge of the lower transparent glass substrate SUB1, while the data signal circuit connecting terminals DTM are extended outward beyond the cutting line CT1 of the lower transparent glass substrate SUB1, are grouped in terminal groups Td (subscripts are omitted) as shown in FIG. 9 and are connected to a short-circuiting line SHd to prevent electrostatic destruction during the fabricating processes. Drain connecting terminals are connected to the opposite side with respect to the matrix of the data lines DL including the inspection terminals TSTd, and the inspection terminals are connected to the opposite side with respect to the matrix of the data lines DL including the drain connecting terminals DTM.

The data signal circuit connecting terminals are formed of the Al layer g1 forming the gate lines GL, and the transparent pixel electrodes ITO1 (d1) for the same reason as the gate circuit connecting terminals GTM. Portions of the insulating film GI, the i-type semiconductor layer AS and the n+-type semiconductor layer d0 are removed to connect the data signal circuit connecting terminals to the data lines DL. Through holes are formed in the protective film PSV1 at positions corresponding to the terminals DTM to connect the terminals DTM to an external circuit. Since the transparent pixel electrodes ITO1 (d1) have a comparatively high resistance, the second conductive film d2 and the third conductive film d3 forming the data lines DL are formed so as to surround the through holes and to be connected to the transparent pixel electrodes ITO1 (d1). Naturally, the second conductive film d2 and the third conductive film d3 are coated with the protective film PSV1.

As shown in FIG. 10(c), each of leads extending between the matrix array and the data signal circuit connecting terminals DTM has a laminated structure consisting of the conductive layers d2 and d3 forming the data lines DL and formed over the Al layer g1 and the first conductive film d1 forming the data signal circuit connecting terminals DTM. The leads terminate in the sealing film SL to reduce the probability of breakage to the least extent and to protect the third conductive film d3 of Al, which is subject to electrolytic corrosion by the protective film PSV1 and the sealing film SL.

Equivalent Circuit of the Liquid Crystal Display

Figure 16:
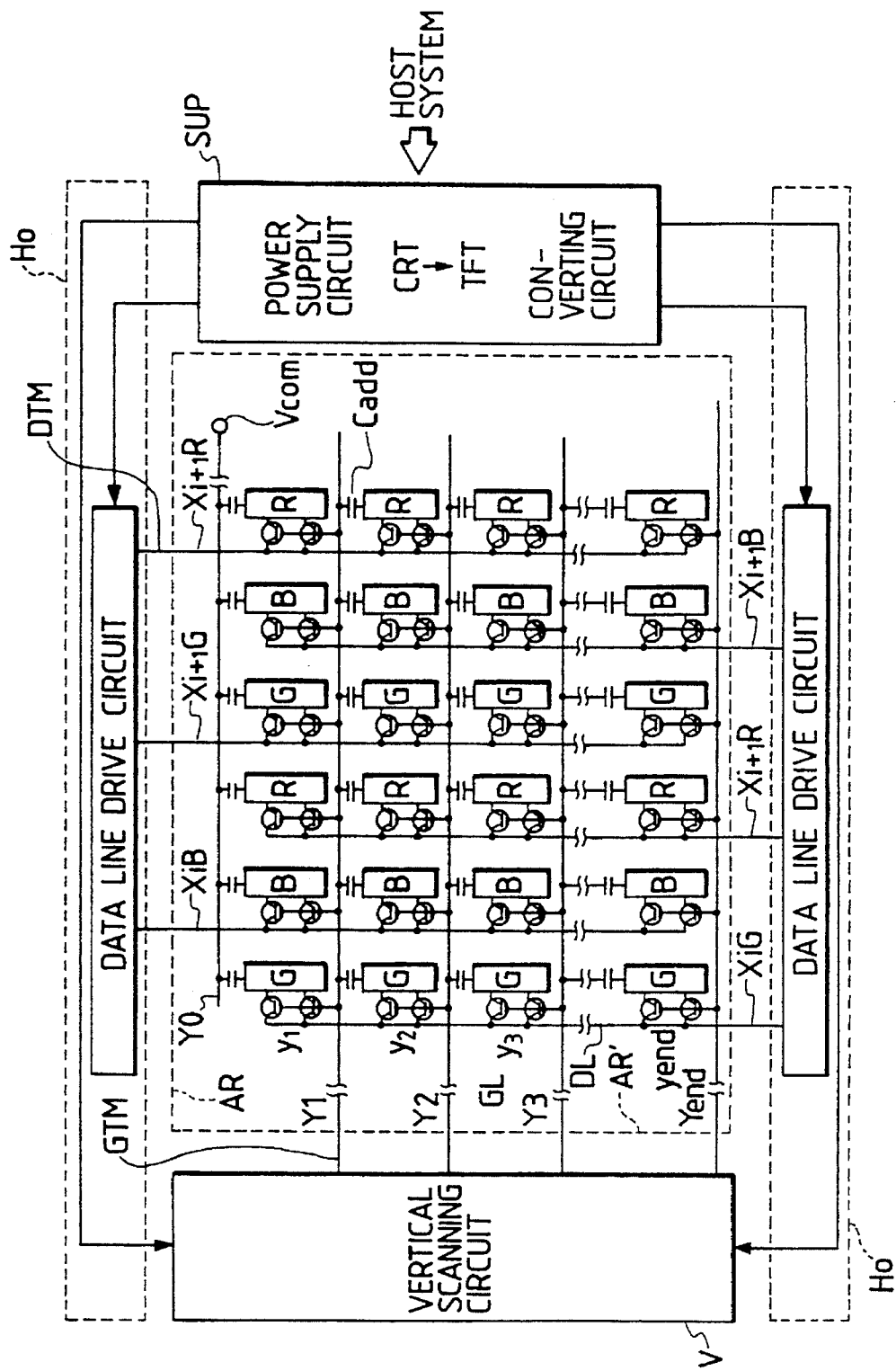
FIG. 16 is a schematic circuit diagram including the matrix area and parts around the matrix area of the active matrix color liquid crystal display.

FIG. 16 is a connection diagram of an equivalent circuit of the display matrix array, and peripheral circuits, in which the arrangement of the components corresponds to the actual geometrical arrangement of the components. The matrix array AR comprises a plurality of pixels arranged in a two-dimensional arrangement. In FIG. 16, the data lines DL are indicated at X, and subscripts R. G and B attached to Xs indicate the data lines DL for red pixels, green pixels and blue pixels, respectively. The gate lines GL are indicated at Y. and subscripts 1, 2, 3, . . . , and the end attached to Ys indicate the scanning order.

The alternate data lines X (subscripts are omitted) are connected to an upper (or an odd-numbered) data line driving circuit He and a lower (or an even-numbered) data line driving circuit Ho.

The gate lines Y (subscripts are omitted) are connected to a vertical scanning circuit V.

A power unit SUP comprises a power supply circuit that provides a plurality of stable voltages by dividing the supply voltage, and a circuit for converting information for a CRT received from a host data processor into information for the TFT liquid crystal display.

Liquid Crystal Display Fabricating Method

Figure 17:
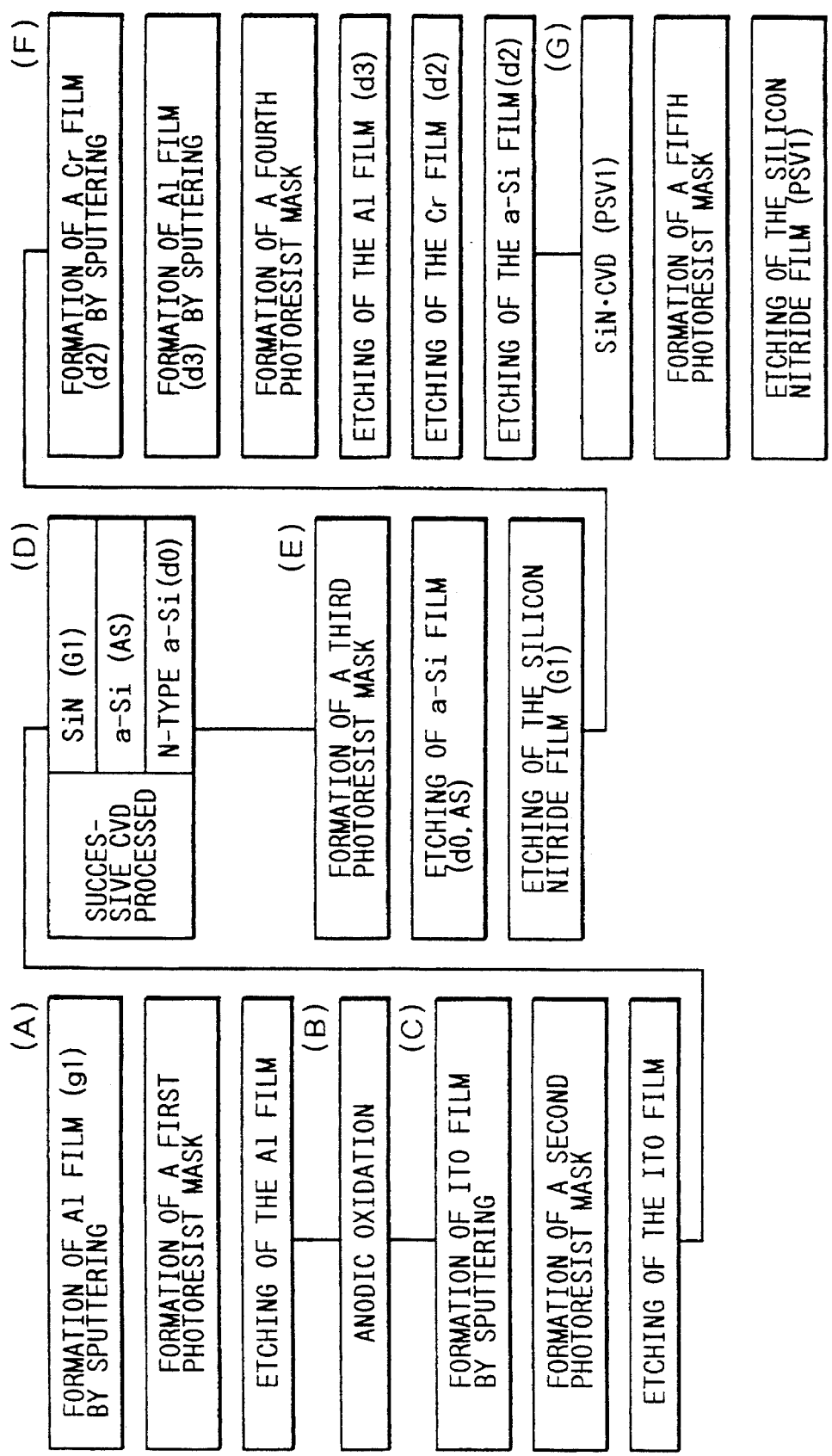
FIG. 17 is a flow chart of a method of fabricating a lower transparent glass substrate SUB1.

A method of fabricating the circuits formed on the lower transparent glass substrate SUB1 of the liquid crystal display will be described hereinafter with reference to FIGS. 17 to 31. FIG. 17 is a flow chart showing all the steps of the liquid crystal display fabricating method; FIGS. 18 to 24 show the pixel shown in FIG. 3; and FIGS. 25 to 31 are sectional views of a portion of the liquid crystal display around the gate circuit connecting terminal shown in FIG. 12 at different stages of the liquid crystal display fabricating method. In FIG. 17, processes A to G excluding processes B and D are photolithographic etching processes. FIGS. 18 and 25, FIGS. 19 and 26, FIGS. 20 and 27, FIGS. 21 and 28, FIGS. 22 and 29, FIGS. 23 and 30 and FIGS. 24 and 31 correspond to the processes A, B, C, D, E, F and G of FIG. 17, and show the state of work after photoresist masks have been removed. In this specification, the photolithographic process includes steps of forming a resist film, subjecting the resist film to selective exposure using a mask and developing the exposed resist film. Duplicate description of the photolithographic process will be omitted.

Figure 25:
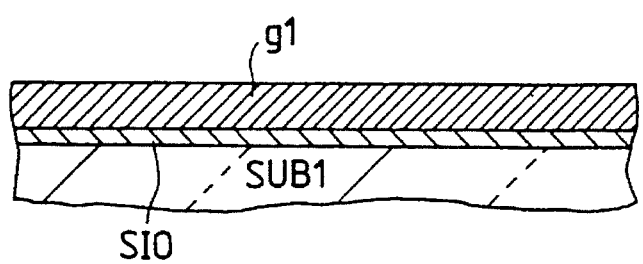
FIG. 25 is a sectional view of a gate terminal component formed on the lower transparent glass substrate SUB1 in the process A of the method shown in FIG. 17.

Process A (FIGS. 18 and 25)

Silicon dioxide films SIO are formed over both major surfaces of the lower transparent glass substrate SUB1 of 7059 glass by dipping, and then the silicon dioxide films SIO are baked at 500° C. for sixty minutes. The silicon dioxide films SIO are formed to reduce the irregularities in the surfaces of the lower transparent glass substrate SUB1 and may be omitted when the surfaces of the lower transparent glass substrate SUB1 are satisfactorily smooth. Then, a 2000-Å thick second conductive film g2 of Al/Ta, Al/Ti/Ta, Al/Pd or such is formed by sputtering over the silicon dioxide film SIO. After forming an etching mask by a photolithographic process, the first conductive film g1 is etched selectively with an etchant containing phosphoric acid, nitric acid and glacial acetic acid.

Figure 19:
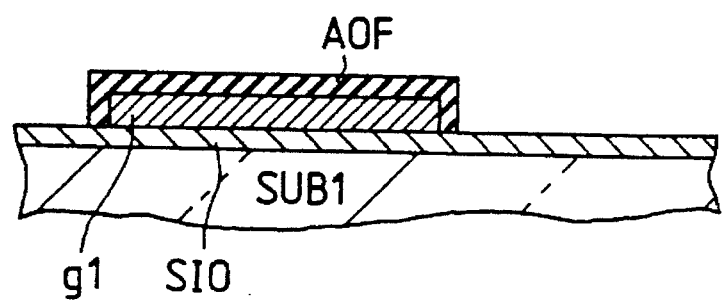
FIG. 19 is a sectional view of pixel components formed on the lower transparent glass substrate SUB1 in a process B of the method shown in FIG. 17.
Figure 26:
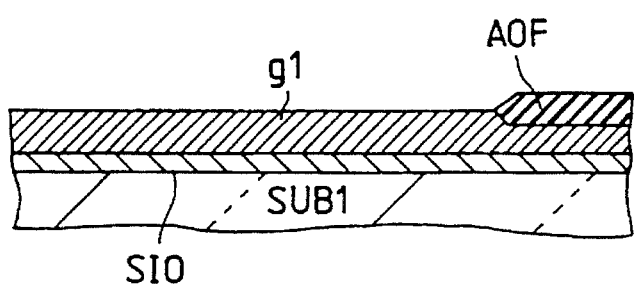
FIG. 26 is a sectional view of gate terminal components formed on the lower transparent glass substrate SUB1 in the process B of the method shown in FIG. 17.

Process B (FIGS. 19 and 26)

After forming a resist film (after forming the pattern AO for anodic oxidation), the lower transparent glass substrate SUB1 is immersed in an anodizing bath prepared by adjusting the acidity of a 3% tartaric acid solution to pH 6.25±0.05 by ammonia and diluting the 3% tartaric acid solution with a ethylene glycol solution in a dilution ratio of 1/9, and the formation current density is adjusted to 0.5 mA/cm2 (constant-current formation). Anodic oxidation is continued until the formation voltage reaches 125V at which an Al2O3 film of a desired thickness is formed. It is desirable to hold the lower transparent glass substrate SUB1 in this state for several tens of minutes (constant-voltage formation) to form a uniform Al2O3 film. Thus, the conductive film g1 is anodized and a 1800-Å thick anodic oxide film AOF is formed over the upper and side surfaces of the gate lines GL. The anodic oxide film AOF serves as part of the gate insulating film of the thin-film transistors TFT.

Figure 20:
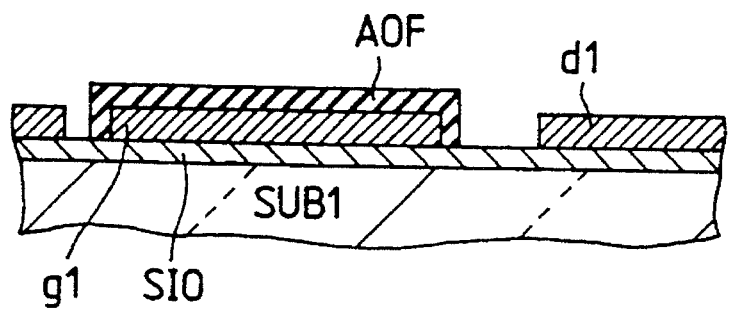
FIG. 20 is a sectional view of pixel components formed on the lower transparent glass substrate SUB1 in a process C of the method shown in FIG. 17.
Figure 21:
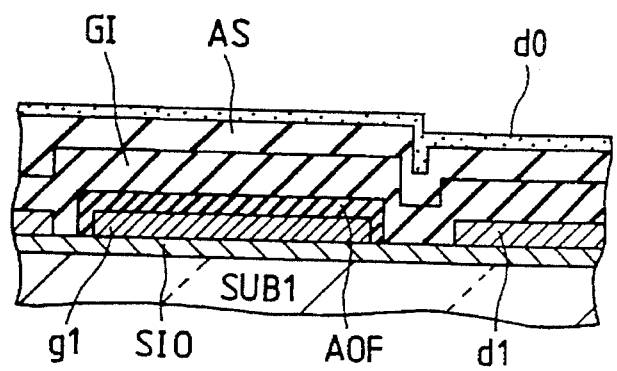
FIG. 21 is a sectional view of pixel components formed on the lower transparent glass substrate SUB1 in a process D of the method shown in FIG. 17.
Figure 27:
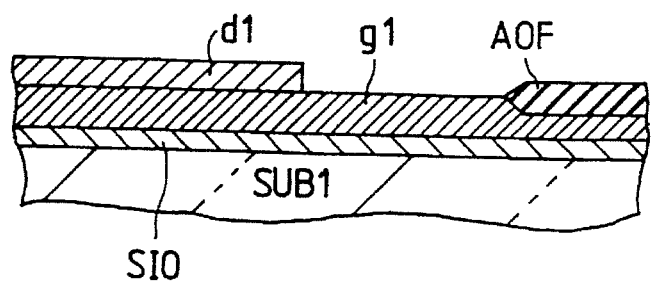
FIG. 27 is a sectional view of gate terminal components formed on the lower transparent glass substrate SUB1 in the process C of the method shown in FIG. 17.
Figure 28:
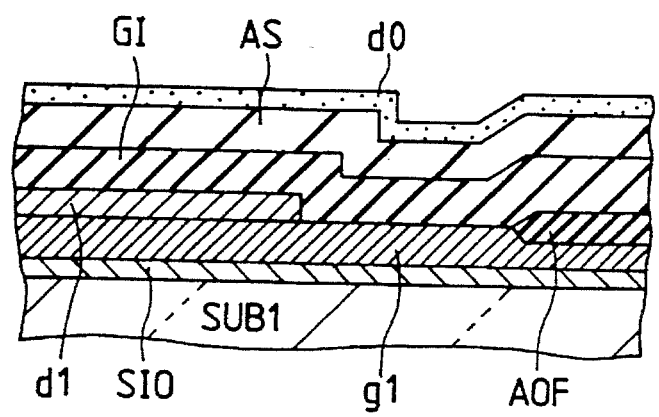
FIG. 28 is a sectional view of gate terminal components formed on the lower transparent glass substrate SUB1 in the process D of the method shown in FIG. 17.

Process C (FIGS. 20 and 27)

A 1400-Å thick conductive film d1 of ITO is formed by sputtering, an etching mask is formed by a photolithographic process, and then the conductive film is etched selectively with an etchant containing chloric acid and nitric acid to form the uppermost layers of gate circuit connecting terminals GTM and data signal circuit connecting terminals DTM, and transparent pixel electrodes ITO1.

Process D

A 2000-Å thick silicon nitride film is formed on a plasma CVD apparatus by using ammonia gas, silane gas and nitrogen gas; a 2000-Å thick i-type amorphous silicon film is formed on the plasma CVD apparatus by using silane gas and hydrogen gas; and then a 300-Å thick n+-type amorphous silicon film is formed on the plasma CVD apparatus by using hydrogen gas and phosphine gas. These films are formed successively in different reaction chambers of the plasma CVD apparatus.

Figure 22:
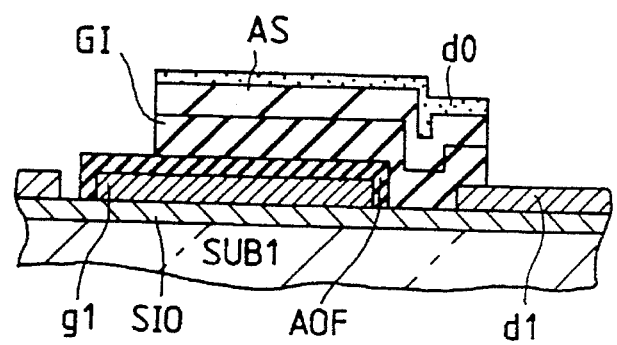
FIG. 22 is a sectional view of pixel components formed on the lower transparent glass substrate SUB1 in a process E of the method shown in FIG. 17.
Figure 29:
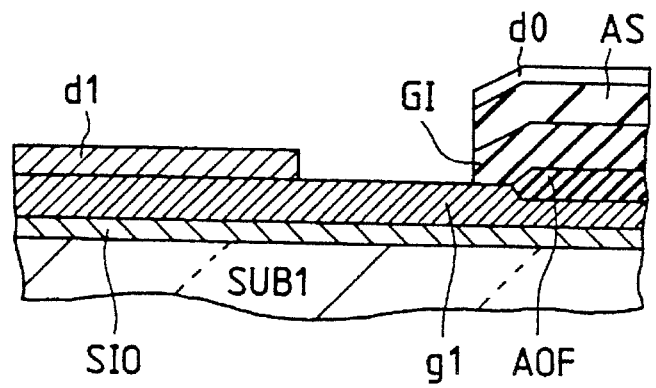
FIG. 29 is a sectional view of gate terminal components formed on the lower transparent glass substrate SUB1 in the process E of the method shown in FIG. 17

Process E (FIGS. 22 and 29)

After forming an etching mask by a photolithographic process, the n+-type amorphous silicon film and the i-type amorphous silicon film are etched with an etching gas containing SF6 and CCl4, and then the silicon nitride film is etched with SF6 gas. Naturally, the n+-type amorphous silicon film, the i-type amorphous silicon film and the silicon nitride film may be successively etched with SF6 gas.

The successive etching of the three layered films formed by CVD with etching gases containing SF6 as a principal component is a feature of the liquid crystal display fabricating method in this embodiment. The increasing order of etching rate of those films with SF6 gas corresponds to the order of the n+-type amorphous silicon film, the i-type amorphous silicon film and the silicon nitride film. Therefore, when the etching of the i-type amorphous silicon film is started after the completion of etching of the n+-type amorphous silicon film, the n+-type amorphous silicon film is side-etched and, consequently, the edges of the amorphous silicon film are inclined at an inclination of about 70°. When the etching of the silicon nitride film starts after the completion of the etching of the i-type amorphous silicon film, the n+-type amorphous silicon film and the i-type amorphous silicon film overlying the silicon nitride film are side-etched in that order and, consequently, the edges of the i-type amorphous silicon film and the silicon nitride film are inclined at inclinations of about 50° and about 20°, respectively. Since the edges of those films are inclined, the probability of breakage of the source electrodes SD1 to be formed over those films is reduced remarkably. Although the edges of the n+-type amorphous silicon film are inclined at an inclination nearly equal to 90°, breakage of the film overlying the n+-type amorphous silicon film rarely occurs because the same film is as thin as about 300-Å. Thus, strictly speaking, the n+-type amorphous silicon film, the i-type amorphous silicon film and the silicon nitride film are not the same in planar pattern; rather, the patterns of the n+-type amorphous silicon film, the i-type amorphous silicon film and the silicon nitride film are greater in that order because the edges of the films are inclined.

Figure 23:
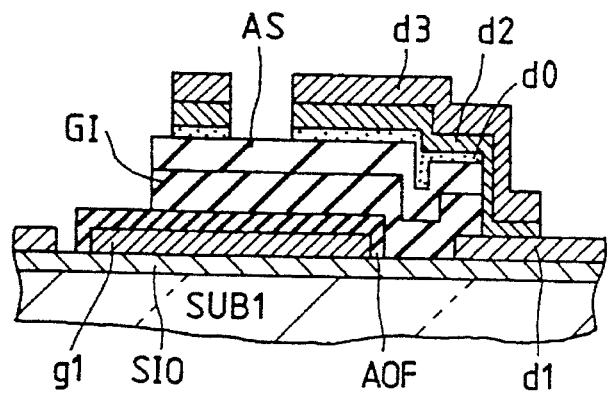
FIG. 23 is a sectional view of pixel components formed on the lower transparent glass substrate SUB1 in a process F of the method shown in FIG. 17.
Figure 30:
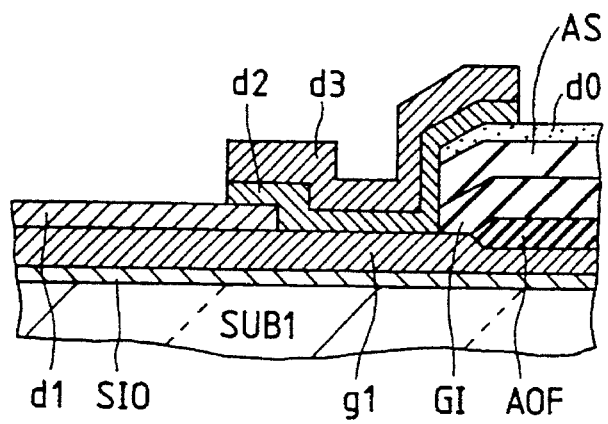
FIG. 30 is a sectional view of gate terminal components formed on the lower transparent glass substrate SUB1 in the process F of the method shown in FIG. 17.

Process F (FIGS. 23 and 30)

A 600-Å thick second conductive film d2 of Cr is formed by sputtering, and then a 4000-Å thick third conductive film d3 of Al/Pd, Al/Si, Al/Ta or Al/Ti/Ta is formed over the second conductive film d2 by sputtering. After forming an etching mask by a photolithographic process, the third conductive film d3 is etched with the same etchant as that used in the process A, and then the second conductive film d2 is etched with a ceric ammonium nitrate solution to form data lines, source electrodes SD1 and drain electrodes SD2.

Since edges of the n+-type amorphous silicon film, the i-type amorphous silicon film and the silicon nitride film are inclined in the process E, the data lines DL may be formed only of the second conductive film d2 if the liquid crystal display has a large allowance for the resistance of the data lines DL. Then, the n+-type amorphous silicon film d0 is etched with SF6 gas and CCl4 gas on a dry etching apparatus to remove portions of the same lying between the source electrodes and the drain electrodes selectively.

Figure 24:
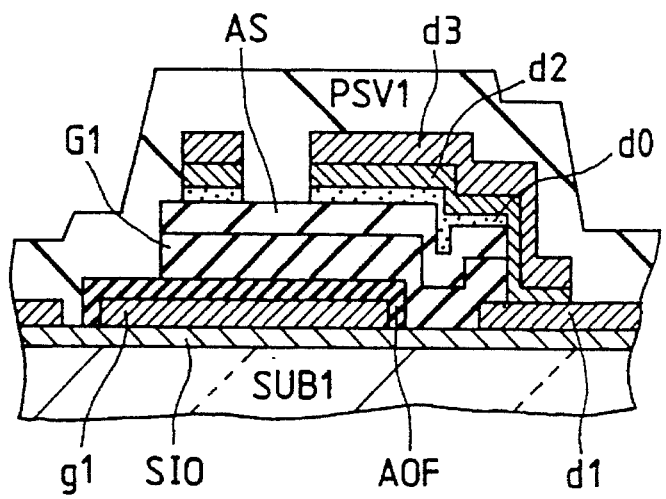
FIG. 24 is a sectional view of pixel components formed on the lower transparent glass substrate SUB1 in a process G of the method shown in FIG. 17.
Figure 31:
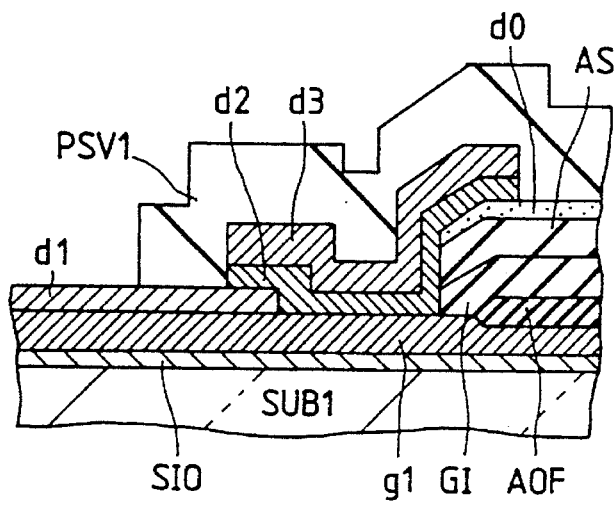
FIG. 31 is a sectional view of gate terminal components formed on the lower transparent glass substrate SUB1 in the process G of the method shown in FIG. 17.

Process G (FIGS. 24 and 31)

Al μm thick silicon nitride film is formed on a plasma CVD apparatus by using ammonia gas, silane gas and nitrogen gas. After forming an etching mask by a photolithographic process over the silicon nitride film, the silicon nitride film is processed for dry etching by using SF6 gas to form a protective film PSV1. The protective film may be formed of an organic material instead of the silicon nitride formed by CVD. The features and effects of the liquid crystal fabricating method of the present invention will be described hereinafter with reference to FIGS. 32 to 37.

Figure 35:
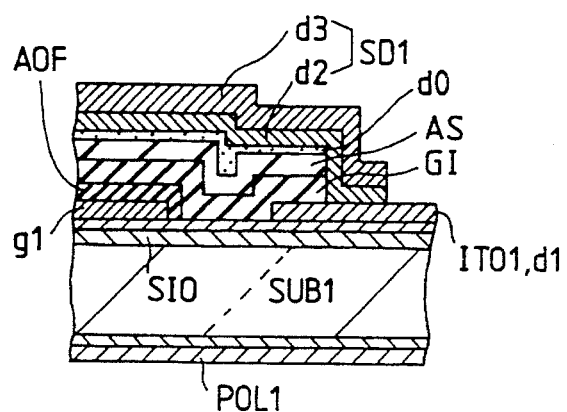
FIG. 35 is a sectional view of a source electrode in a state where the semiconductor layer and the insulating film have been etched.
Figure 37:
FIG. 37 is a table showing the respective inclinations of the edges of layers formed in the processes described with reference to FIGS. 33 and 34.

FIGS. 32 to 37 are sectional views of part of the section taken on line 3—3 in FIG. 1, in which the source electrode SD1 (d3 and d2) of the thin-film transistor TFT is connected to the transparent pixel electrode ITO1 (d1) at different stages of the photolithographic etching process of the semiconductor layers d0 and AS and the insulating film GI. FIG. 35 shows a section in which the films are patterned exactly in the dimensions of the photoresist mask; FIG. 36 shows the actual shapes of the films formed by actual processes (FIGS. 32 to 34); and FIG. 37 is table of the inclination of each of the etched edges of the n+-type semiconductor layer d0, the i-type semiconductor layer AS and the silicon nitride insulating film GI to a horizontal plane.

The procedure of the liquid crystal display fabricating method and the variation of the sectional shape of the work with the progress of the procedure will be described with reference to FIGS. 32 to 34. A 2000-Å thick silicon nitride film (GI), A 2000-Å thick i-type amorphous silicon film (AS) and a 300-Å thick n+-type amorphous silicon film (d0) are formed on a plasma CVD apparatus by a procedure similar to that of the process D. The surface of the layers of these films is coated with a photoresist film RES, and then the photoresist film RES is developed in a pattern corresponding to that of the source electrodes SD1 (FIG. 32).

Then, the n+-type amorphous silicon film and the i-type amorphous silicon film are processed for dry etching by using SF6 gas and CCl4 gas as etching gases. The ratio in etching rate in the dry etching process between the i-type semiconductor layer AS, the n+-type amorphous silicon film d0 and the silicon nitride film GI is 1:about 4:about 0.25. Therefore, the n+-type amorphous silicon film d0 underlying the photoresist film RES is side-etched greatly. When the etching of the i-type semiconductor layer AS starts after the complete removal of the exposed portions of the n+-type amorphous silicon film d0, the n+-type amorphous silicon film d0 overlying the i-type semiconductor layer AS is further side-etched and, consequently, the edges of the i-type semiconductor layer AS underlying the n+-type amorphous silicon film d0 are etched in inclined edges inclined at an inclination of 70°. The surface of the insulating film GI is etched to some extent during the etching of the i-type semiconductor layer AS.

Subsequently, the silicon nitride film is etched with SF6 gas by a dry etching process. In this dry etching process, the respective etching rates of the films triple. The ratio in selective etching rate between the i-type semiconductor layer AS, the n+-type amorphous silicon film d0 and the silicon nitride film GI is 1:about 1.5:about 0.2. Accordingly, the n+-type amorphous silicon film d0 and the i-type semiconductor layer AS are side-etched in that order, and the edges of the i-type semiconductor layer AS are etched in inclined edges inclined at an inclination of 50° and those of the silicon nitride film GI are etched in inclined edges inclined at an inclination of 20°.

As shown in FIG. 36, the inclined edges improve the step coverage of the source electrodes SD1 (d2, d3) remarkably, so that the probability of breakage of the source electrodes SD1 at steps is reduced greatly, point defects are reduced, and the ratio of defective liquid crystal display in respect of picture quality is reduced. FIG. 37 shows the inclinations of the edges of the films formed by the foregoing processes. Although the inclination of the n+-type amorphous silicon layer d0 is large, no problem arises in the step coverage of the n+-type amorphous silicon layer d0 because the thickness of the same is as small as 300-Å. Thus, the source electrodes SD1, the drain electrodes SD2 and the data lines DL will not break even if they are formed only of the second conductive film d2. The advantageous effect of the inclined edges is particularly significant in the three-layer structure constructed by forming the silicon nitride film GI, the i-type semiconductor layer AS and the n+-type amorphous silicon film d0 in that order from the bottom upward. Therefore, for example, if the n+-type amorphous silicon film d0 is omitted, the inclination of the edges of the i-type semiconductor layer AS increases to 90°. The inclinations of the edges of the films are dependent on the type of the etching gas. Although $CF_4$ gas may be used instead of $SF_6$ gas, the inclinations of the edges of the films are dependent on the fluorine content of the etching gas; and, the greater the fluorine content, the deeper is the undercut and the greater is the inclination.

Configuration of the Liquid Crystal Display Module

Figure 38:
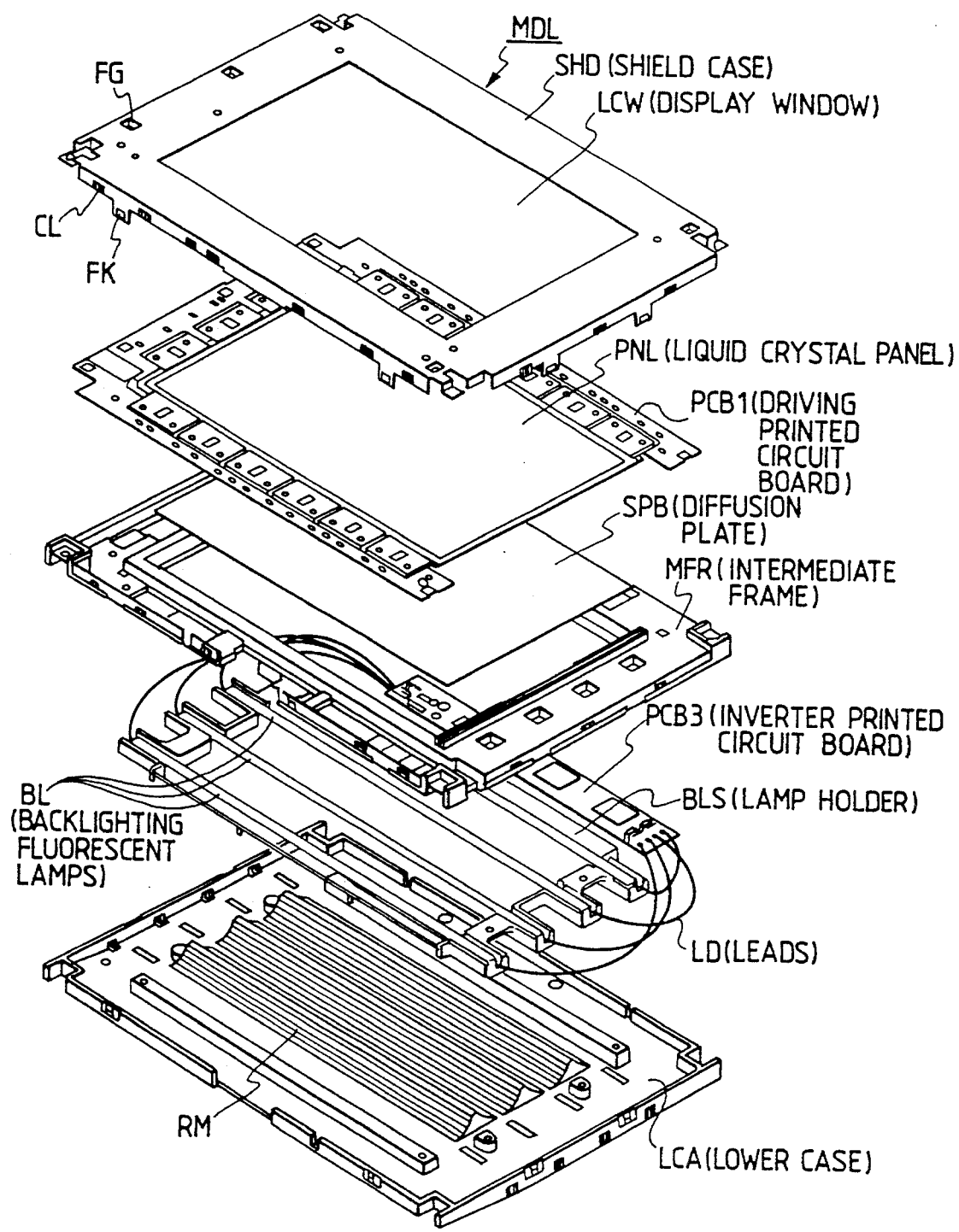
FIG. 38 is an exploded perspective view of a liquid crystal display module.

FIG. 38 is an exploded perspective view showing the component parts of a liquid crystal display module.

In FIG. 38, there are shown a frame-like shield case SHD (metal frame), a display window LCW formed in the shield case SHD, a liquid crystal panel PNL, a diffusion plate SPB, an intermediate frame MFR, backlighting fluorescent lamps BL, a lamp holder BLS and a lower case LCA, which are stacked in that order to form a liquid crystal display module MDL.

Those components of the liquid crystal display module MDL are fastened together with claws CL and hooks FK formed on the shield case SHD.

The intermediate frame MFR is provided with an opening corresponding to the display window LCW, recesses and projections corresponding to the shapes and sizes of the lamp holder BLS and the circuit components, and heat releasing openings.

The lower case LCA serves also as a reflector for reflecting the light emitted by the backlighting fluorescent lamps and is provided with reflecting ridges RM at positions corresponding to the fluorescent lamps BL for efficient reflection.

Liquid Crystal Display Panel PNL and Driving Printed Circuit Board PCB1

Figure 39:
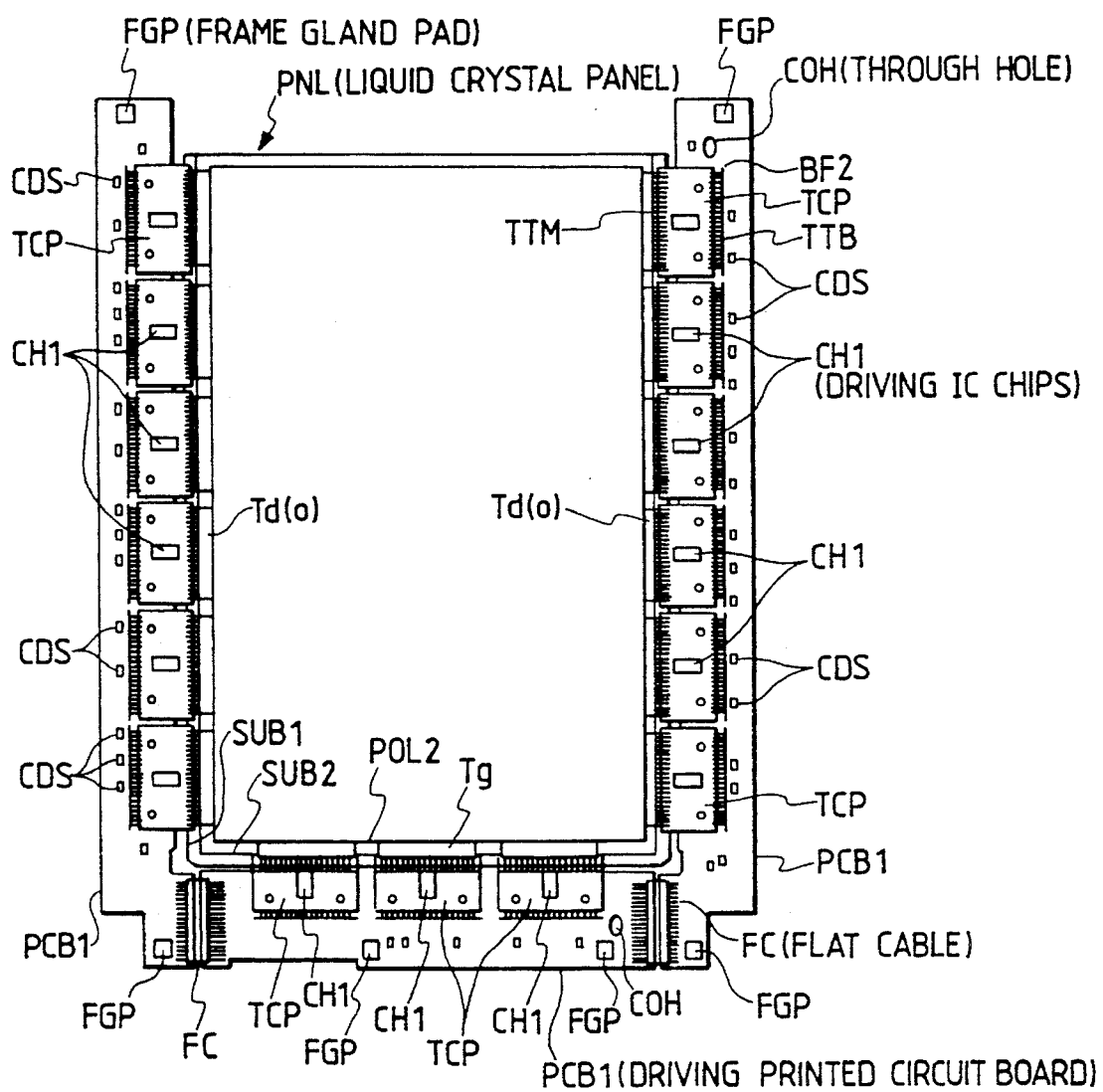
FIG. 39 is a top plan view of a liquid crystal display panel incorporating driving circuits.

FIG. 39 is a top plan view of the liquid crystal display panel PNL incorporating data signal driving circuits He and Ho, and a gate signal driving circuit V.

Figure 40:
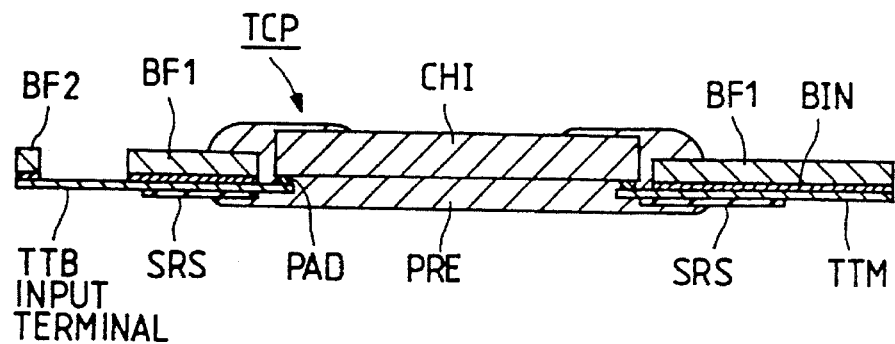
FIG. 40 is a sectional view of a tape carrier package TCP.
Figure 41:
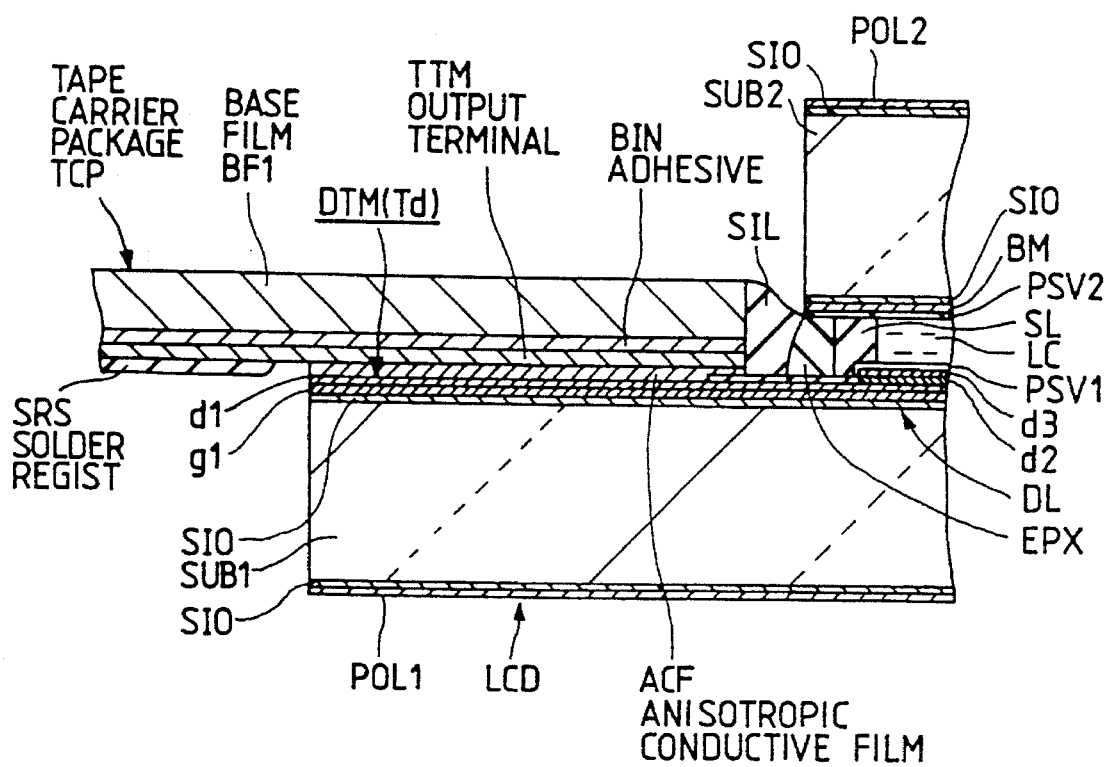
FIG. 41 is a sectional view of an exemplary portion of the liquid crystal display module.

In FIG. 39, there are shown driving IC chips CHI for driving the liquid crystal display panel PNL, including three driving IC chips CHI arranged on the lower side as the components of a vertical scanning circuit, and six driving IC chips CHI arranged on the right side and six driving IC chips CHI arranged on the left side as the components of a data signal driving circuit; tape carrier packages TCP formed by packaging the driving IC chips CHI by a tape automated bonding method (TAB), which will be described later with reference to FIGS. 40 and 41, a driving printed circuit board PCB1 holding the tape carrier packages TCP and capacitors CDS and divided into three divisions, lugs FG formed by raising portions of the shield case SHD, frame gland pads FGP to which the lugs FG are soldered, respectively, and flat cables FC electrically connecting the driving circuits of the lower driving printed circuit board PCB1 and those of the right and left driving printed circuit board PCB1. Each flat cable is formed by sandwiching a plurality of leads between a polyethylene strip and a polyvinyl alcohol strip.

Tape Carrier Package Connecting Configuration

FIG. 40 is a sectional view of the tape carrier package TCP formed by mounting the IC chip CH1 provided with the gate signal driving circuit V and the data signal driving circuits He and Ho on a flexible wiring board, and FIG. 41 is a sectional view of an exemplary part of the tape carrier package TCP connected to the data circuit connecting terminals DTM of the liquid crystal display panel.

Referring to FIGS. 40 and 41, the inner ends (inner leads) of output terminals TTB formed of Cu and input terminals TTM formed of Cu for the IC chip CHI are connected to the bonding pads PAD of the IC chip CHI by a facedown bonding method, and the outer ends (outer leads) of the input terminals TTB and the output terminals TTM are soldered to the power unit SUP of the liquid crystal display panel PNL with an anisotropic conductive film ACF. The tape carrier package TCP is connected to the liquid crystal display panel PNL so as to cover protective film PSV1, formed so as to expose the data signal circuit connecting terminals DTM. Since the data signal circuit connecting terminals DTM (the gate circuit connecting terminals GTM) are covered at least with either the protective film PSV1 or the tape carrier package TCP, the same are protected from electrolytic corrosion. The tape carrier package has a base film BF1 of polyimide or the like, and a solder resist film SRS for masking the peripheral parts so that solder droplets may not stick to the peripheral parts. The space between the upper transparent glass substrate SUB2 and the lower transparent glass substrate SUB1 on the outside of the sealing film SL is filled up with an epoxy resin EPX or the like, and the gap between the tape carrier package TCP and the upper transparent glass substrate SUB2 is filled up with a silicone resin SIL for protection.

Driving Printed Circuit Board PCB2

Figure 42:
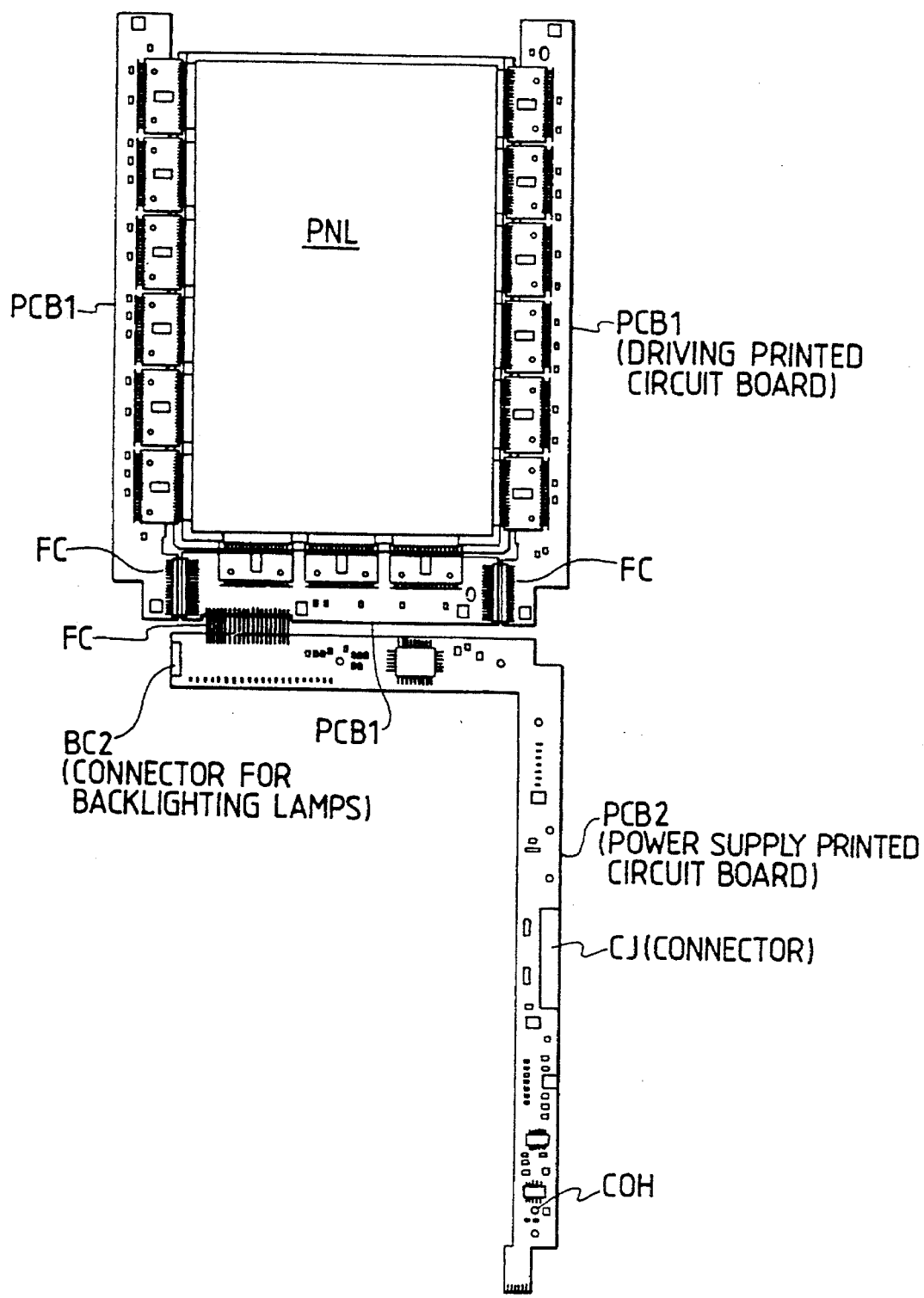
FIG. 42 is a top plan view which provides assistance in explaining the connection of a driving printed circuit board PCB1 and a power supply printed circuit board PCB2.

As shown in FIG. 42, an L-shaped driving printed circuit board PCB2 for driving a liquid crystal display unit LCD held on the intermediate frame MFR is mounted with electronic parts including IC chips, capacitors and resistors. The driving printed circuit board PCB2 is mounted with a power supply circuit that provides a plurality of stable voltages by dividing the supply voltage, and the power unit SUP has a circuit for converting information for a CRT provided by a host system (host data processor) into information for the TFT liquid crystal display. A connector CJ is connected to the connector of an external device. The driving printed circuit board PCB2 is connected electrically to an inverter printed circuit board PCB3 with a backlight cable extended through an opening formed in the intermediate frame MFR.

The driving printed circuit boards PCB1 are connected electrically to driving printed circuit board PCB2 with a flexible flat cable FC. When assembling the liquid crystal display, the flexible flat cable FC is folded in two, and the driving printed circuit board PCB2 is put on the lower side of the driving printed circuit boards PCB1 and is placed in a recess formed in the intermediate frame MFR.

SECOND EMBODIMENT

Figure 43:
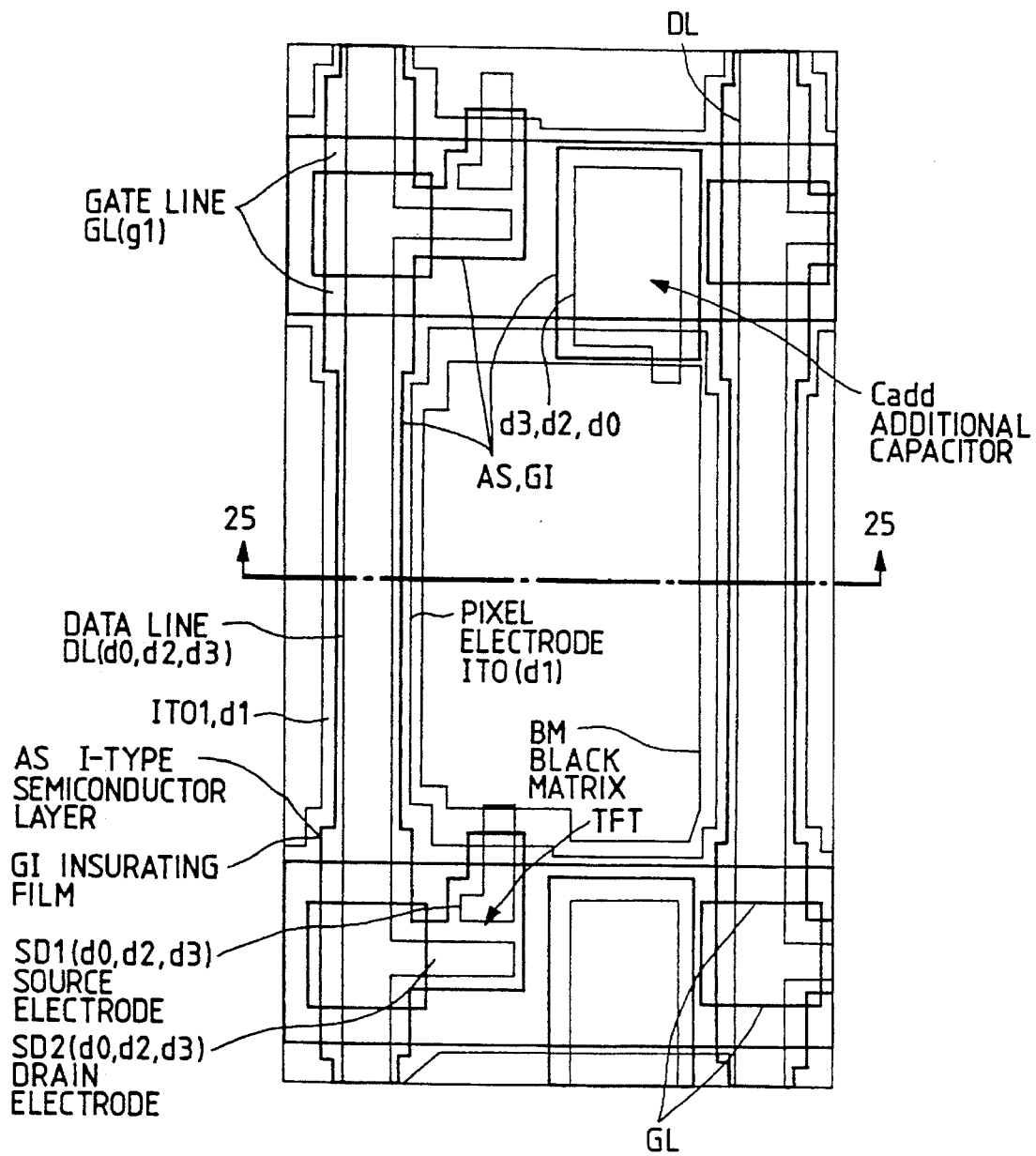
FIG. 43 is a plan view of an exemplary portion of an active matrix color liquid crystal display in a second embodiment.
Figure 44:
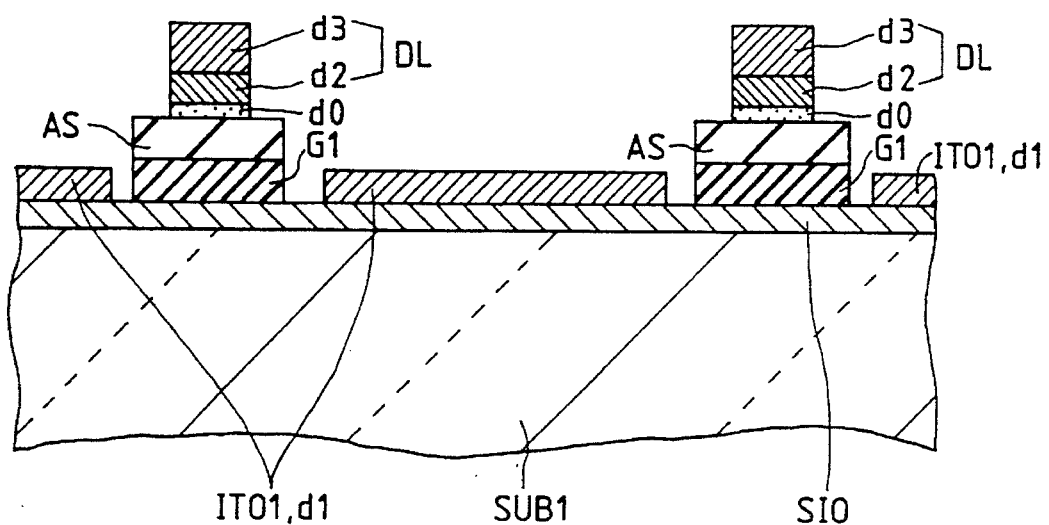
FIG. 44 is a sectional view taken on line 25—25 in FIG. 43, showing the thin-film transistor TFT of a pixel and neighboring components.

A liquid crystal display forming a second embodiment according to the present invention will be described with reference to FIGS. 43 and 44. FIG. 43 is a plan view showing a pixel of a picture display unit and neighboring components, and FIG. 44 is a sectional view taken on line 25—25 in FIG. 43.

The relation between the planar pattern of an i-type semiconductor layer AS formed along transparent pixel electrode ITO1 (d1) and data lines DL and the planar pattern of an insulating film GI is the feature of this embodiment. As shown in FIG. 43 in a plan view, the contours of the i-type semiconductor layer AS and the insulating film GI do not extend on the transparent pixel electrodes ITO1. The sectional construction of thin-film transistors TFT included in this liquid crystal display is the same as that of the thin-film transistors TFT of the liquid crystal display in the first embodiment show in FIG. 3.

The most important features and their effects will be described with reference to FIG. 44. Shown in FIG. 44 in a sectional view is a structure having a transparent pixel electrode d1 formed between adjacent data lines DL. The transparent pixel electrode d1 does not underlie the i-type semiconductor layer AS and the insulating film GI and, therefore, the capacitive load on the data line DL is smaller than that on the data line DL of the liquid crystal display in the first embodiment. In the first embodiment (FIG. 5), since the i-type semiconductor layer AS overlies the pixel electrodes d1 to form an apparent MIS structure, the capacitance of the wiring is large. Therefore, when the liquid crystal display is a large one, delay in applying a voltage to the data lines DL increases and, in some cases, the capacitive coupling of the transparent pixel electrodes ITO1 and the data lines DL causes longitudinal crosstalk on the screen. The structure in the second embodiment reduces crosstalk. In this structure, the intervals between the transparent pixel electrodes d1 and the data lines are comparatively large and there is the possibility of reduction in the aperture ratio. However, the aperture ratio of the large liquid crystal display is reduced very little because the pixels of the large liquid crystal display are comparatively large.

In the structure in the second embodiment, Cr. i.e., a metal having a high melting point and forming the second conductive film d2, adheres to an n+-type semiconductor layer d0 and hence the probability of breakage of the data lines DL is reduced. Although the effect in preventing the breakage of the data lines DL seems to be produced by forming only the n+-type semiconductor layer d0 and the i-type semiconductor layer AS under the data lines DL by separate photolithographic etching processes, the increase in the inclinations of the edges as shown in FIG. 37 will increase the possibility of breakage. Although it is theoretically possible to construct a structure equivalent to that of this embodiment by separate photolithographic etching processes, actually, the same effect as that of this embodiment cannot be produced due to inaccurate superposition of the photomasks used in the separate photolithographic processes. The highest effect of this embodiment is produced when the n+-type semiconductor layer d0 is formed over the i-type semiconductor layer AS by dry etching using SF6 gas.

THIRD EMBODIMENT

Figure 45:
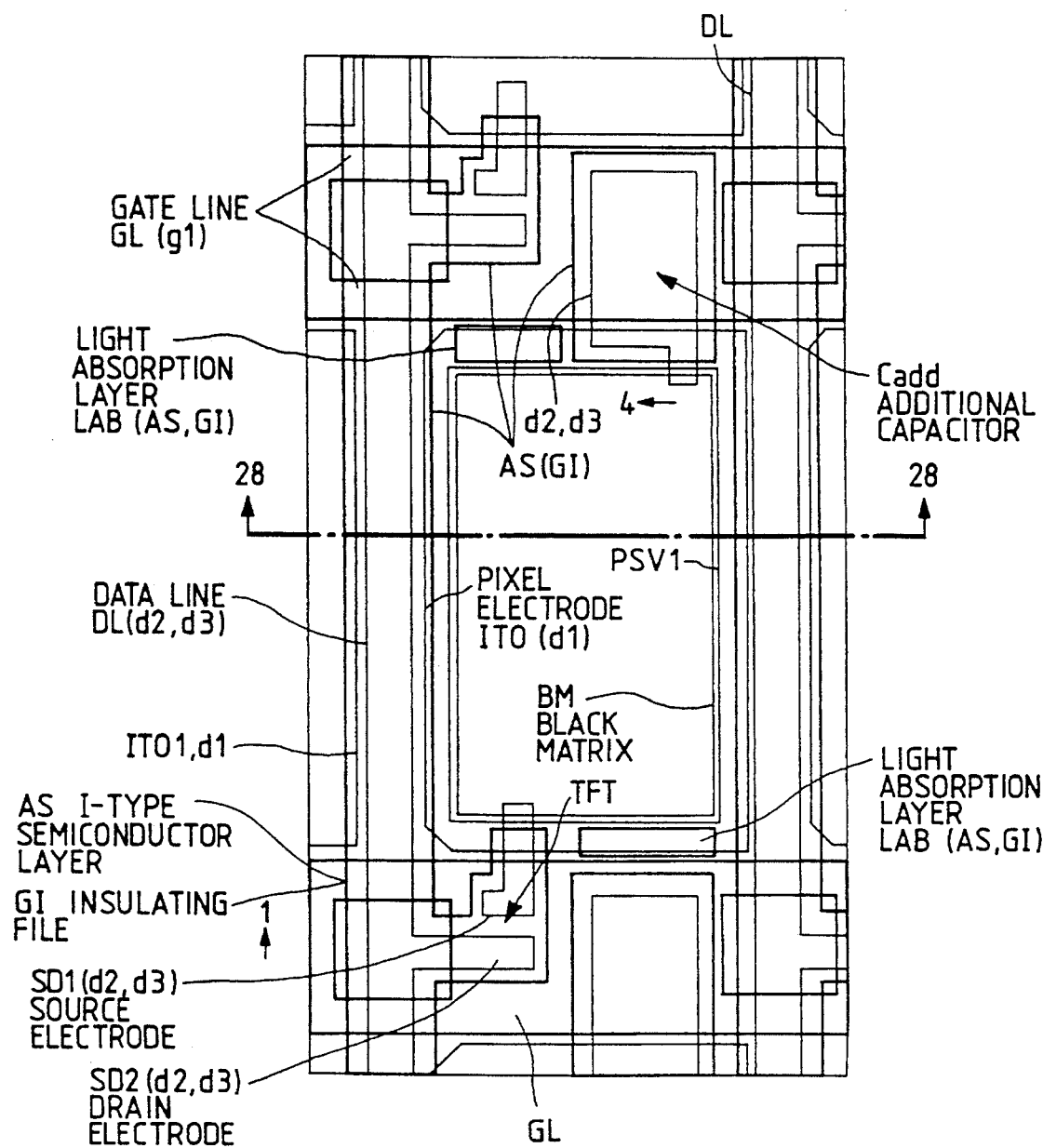
FIG. 45 is a plan view of an exemplary portion of an active matrix color liquid crystal display in a third embodiment.
Figure 46:
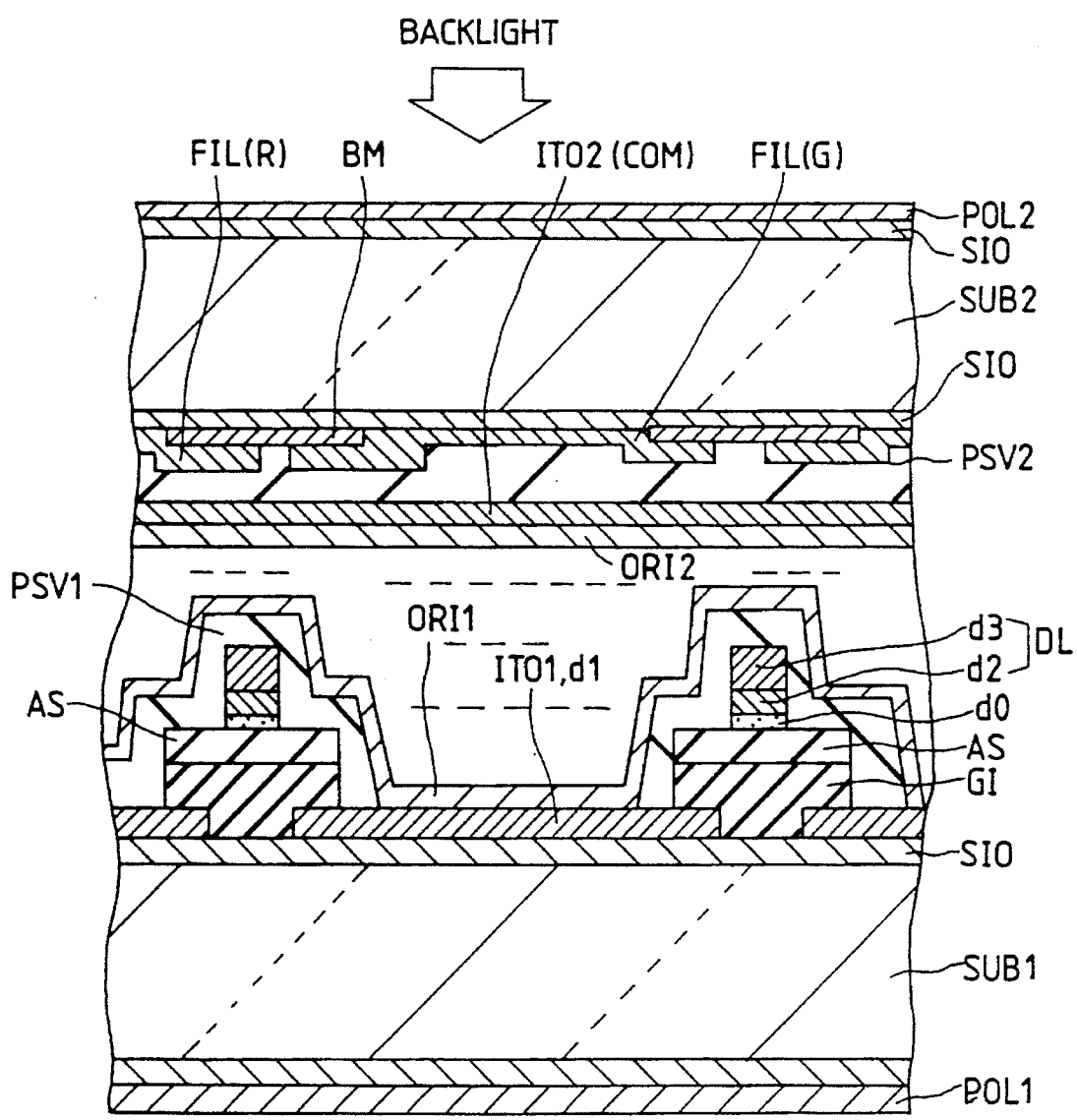
FIG. 46 is a sectional view taken on line 27—27 in FIG. 45.
Figure 47:
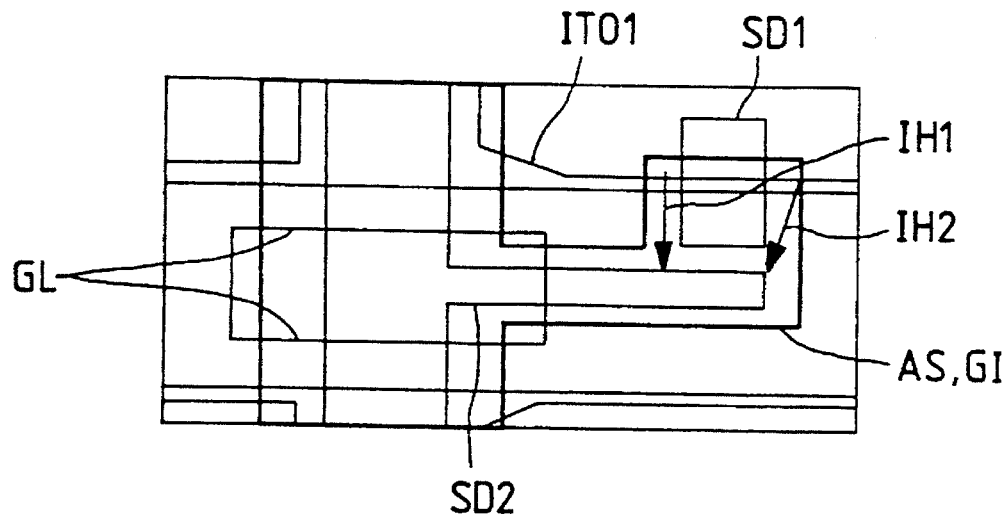
FIG. 47 is a plan view of a thin-film transistor TFT formed near the intersection of a gate line and a data line.

A liquid crystal display forming a third embodiment according to the present invention will be described with reference to FIGS. 45 and 46. FIG. 45 is a plan view of pixels of the liquid crystal display in the third embodiment, and FIG. 46 is a sectional view taken on line 27—27 in FIG. 45.

A structure suitable for enabling a liquid crystal display to display pictures with a very high contrast is the feature of the present invention. In the first embodiment, the i-type semiconductor layer AS underlying the data lines is formed so as to overlap the pixel electrodes ITO1 (d1) as shown in FIG. 5 to suppress reflection and to display a black picture with a high contrast when the liquid crystal display is used in an environment having a high illuminance. In this embodiment, light absorbing layers (in this embodiment, two light absorbing layers) having a laminated construction of an i-type semiconductor layer AS and an insulating film GI are formed along gate lines GL over the pixel electrode ITO1 as shown in FIG. 45. The light absorbing layers further suppress reflection and improve the contrast of a black picture.

The transmittance in a white display mode, in which the voltage across the pixel electrode ITO1 and a common transparent pixel electrode ITO2 formed on an upper transparent glass substrate SUB2 is zero or 2 V or below, is a factor affecting picture quality in respect of contrast. As mentioned above, the i-type semiconductor layer AS absorbs light. The insulating film GI containing Si and the protective film PSV1 also absorb light through their absorbances are as small as ⅓ of that of the i-type semiconductor layer AS, the insulating film GI and the protective film PSV1 reduces the transmittance in the white display mode. Accordingly, in this embodiment, the protective film PSV1 is formed on the inside of a shading film BM, i.e., on the outside of an opening, and through holes are formed in the protective film PSV1 by etching, and the insulating film GI and the protective film PSV1 are not formed for transmitted light on the lower transparent glass substrate SUB1. Since the protective film PSV1 shown in FIGS. 45 and 46 not having such a contour can be removed by the process G of FIG. 17 for fabricating the liquid crystal display in the first embodiment, any additional process is not necessary.

FOURTH EMBODIMENT

Figure 48:
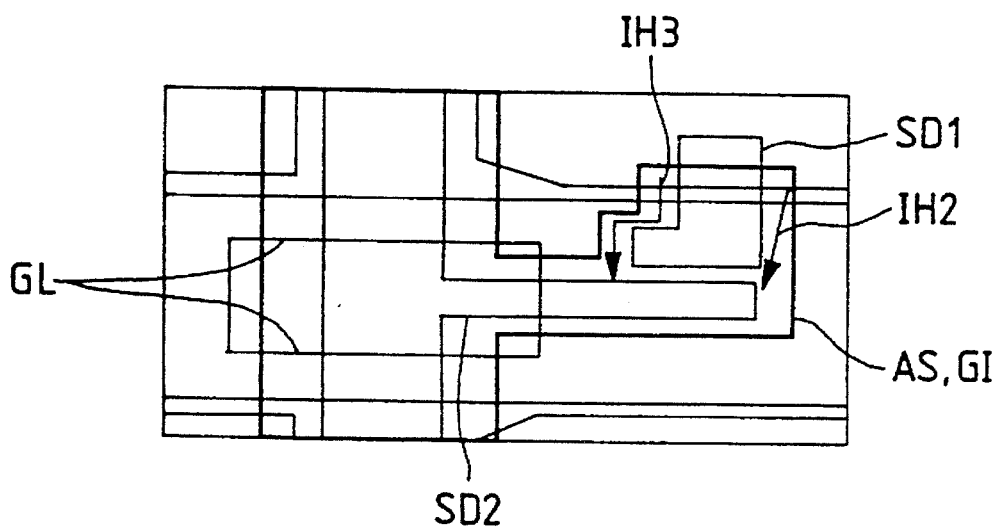
FIG. 48 is a plan view of a thin-film transistor TFT having an improved construction and formed near the intersection of a gate line and a data line.
Figure 49:
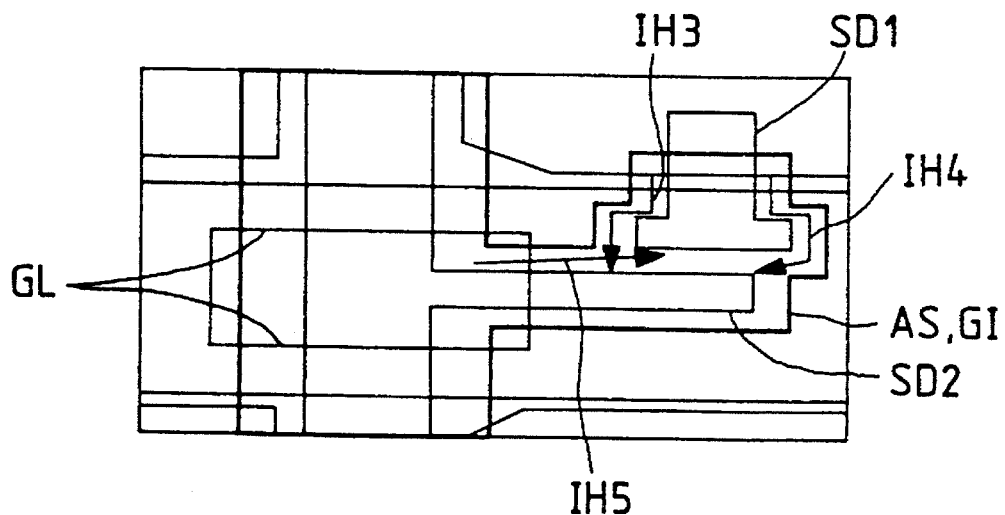
FIG. 49 is a plan view of another thin-film transistor TFT having an improved construction and formed near the intersection of a gate line and a data line.
Figure 50:
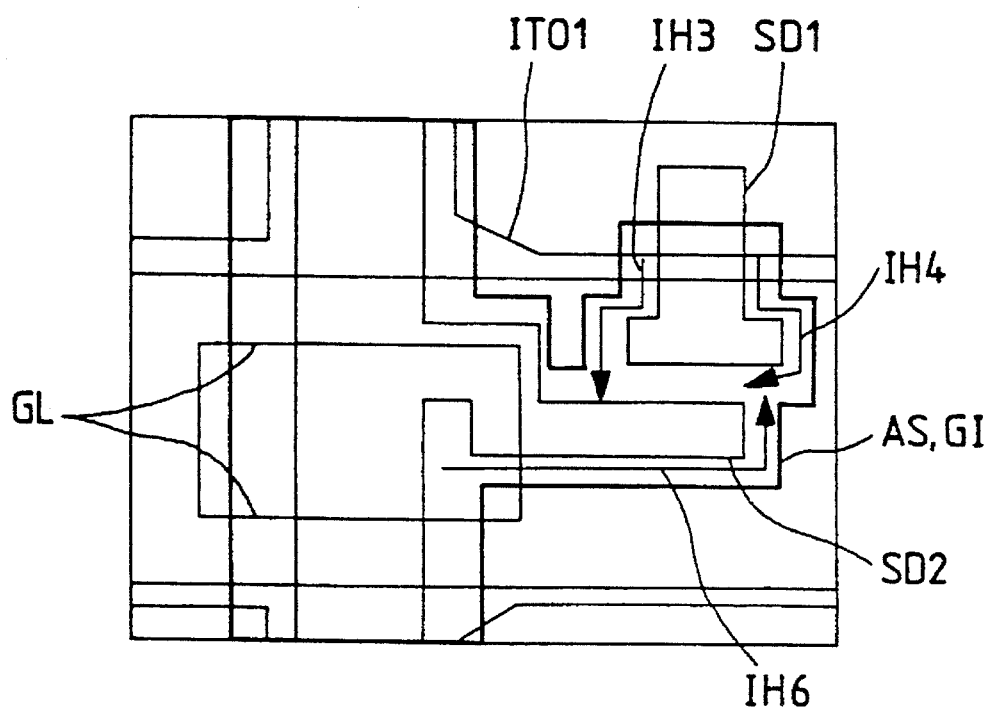
FIG. 50 is a plan view of a further thin-film transistor TFT having an improved construction and formed near the intersection of a gate line and a data line.

A liquid crystal display forming a fourth embodiment according to the present invention will be described with reference to FIGS. 47 to 50 showing a planar pattern of a thin-film transistor TFT formed near the intersection of a gate line GL and a data line DL. FIGS. 48 to 50 show patterns formed by incorporating improvements into a pattern shown in FIG. 47.

A liquid crystal display in the fourth embodiment according to the present invention suppresses leakage current in the thin-film transistor TFT when the i-type semiconductor layer AS of the thin-film transistor TFT is illuminated with light, to improve the contrast of pictures.

As shown in FIGS. 47 to 50, an i-type semiconductor layer AS and an insulating film GI are formed in a pattern extending beyond the edges of a gate line GL. Backlight falls on the outer surface of an upper transparent glass substrate SUB2, as shown in FIG. 5. Since a shading film BM is formed on the upper transparent glass substrate SUB2, as shown in FIGS. 1 and 5, the backlight does not fall directly on the i-type semiconductor layer AS and hence any significant problem does not arise.

On the other hand, when light transmitted through a lower transparent glass substrate SUB1 on which thin-film transistors TFT are formed falls in a region outside the gate line GL, carriers. i.e., electrons or holes, generated in the vicinity of the source electrode SD1 move to the drain electrode SD2 by an electric field applied to the source electrode SD1 and the drain electrode SD2 (data line DL), increasing leakage current in the thin-film transistor TFT. Consequently, the charge accumulated in the liquid crystal capacitor is discharged to reduce the contrast of the picture. When leakage current is increased by such a mechanism, current flows along current paths IH1 and IH2 in a pattern shown in FIG. 47, and flows along current paths IH3 and IH4 in a pattern shown in FIG. 48. Since the current path IH3 is longer than the current path IH1, a recombination current increases accordingly and, consequently, the age current caused by light is reduced. Whereas the current paths IH1 and IH2 between the portion of the i-type semiconductor layer AS extending beyond the gate line, and the drain electrode are straight and do not cross the source electrode SD1 at all in the pattern shown in FIG. 47, the current path IH3 in the pattern shown in FIG. 48 is staggered. The pattern shown in FIG. 48 is the same as the construction of the first embodiment of the present invention shown in FIG. 1.

In a construction shown in FIG. 49, both current paths IH3 and IH4 are staggered and comparatively long, so that leakage current is reduced and the contrast of the picture is improved.

However, in the construction shown in FIG. 49, a straight current path IH5 extends from a portion of the i-type semiconductor layer AS, not overlapping the gate line GL in the vicinity of the drain electrode SD2 to the source electrode SD1 without crossing the drain electrode SD2. A construction shown in FIG. 50 is formed taking into consideration the current path IH5 to further reduce leakage current. In FIG. 50, any current path corresponding to the current path IH5 is formed in the vicinity of the drain electrode SD2 in which the gate line does not extend, and a current path IH6 is formed, whereby the resistance is high, the leakage current is small and hence the contrast of pictures is very high.

Thus, in this embodiment, a staggered area is formed between the edge of a planar pattern of a semiconductor layer forming the thin-film transistor TFT and the edge of a planar pattern of the source electrode or the drain electrode to reduce leakage current.

The present invention provides a liquid crystal display capable of being manufactured at a high yield and at a low manufacturing cost of displaying pictures in a high picture quality, and a method of fabricating such a liquid crystal display.

What is claimed is:

1. A method of fabricating a liquid crystal display comprising: a substrate having a main surface, metal gate lines formed on the main surface of said substrate, data lines formed so as to intersect the gate lines, with respect to a plan view of the substrate main surface, at substantially right angles, thin-film transistors formed-near the intersections of the gate lines and the data lines, and pixel electrodes connected to the thin-film transistors to drive a liquid crystal material; comprising the steps of:

anodizing upper and end side surfaces of the gate lines formed on the main surface of said substrate, respectively; and continuously patterning insulating films and semiconductor layers stacked thereon, respectively, in a manner such that, with respect to a plan view of the substrate main surface, the patterns effected for each stacked pair of an insulating film and a semiconductor layer are substantially the same and coincide, each such stacked pair covering at least part of the anodized oxide film on respective ones of said gate lines.

2. A liquid crystal display comprising:

a substrate;

gate lines formed on said substrate;

data lines intersecting with said gate lines in a matrix shape;

thin-film transistors formed near the intersections of said gate lines and said data lines, respectively;

pixel electrodes connected to said thin-film transistors, respectively, to drive a liquid crystal material provided in said display, said pixel electrodes being formed on said substrate, respectively;

an insulating layer formed on said substrate along said data lines, respectively; and a semiconductor layer formed on said insulating layer and having substantially a same pattern as that of said insulating layer, wherein said data lines are formed on said semiconductor layer.

3. A liquid crystal display according to claim 2, wherein said insulating layer is disposed to be partially overlapping with said pixel electrodes.

4. A liquid crystal display according to claim 2, wherein said semiconductor layer is dimensioned to have a width which is greater than that of said data lines, respectively.

5. A liquid crystal display according to claim 2, wherein said semiconductor layer consists of an intrinsic type semiconductor layer.

6. A liquid crystal display according to claim 2, wherein said gate lines are coated with an anodic oxide film, respectively.

7. A liquid crystal display according to claim 2, wherein each of said thin-film transistors uses a corresponding one of said gate lines as a gate electrode, a corresponding said insulating layer being formed on said gate electrode and said semiconductor layer being formed on said insulating layer.

8. A liquid crystal display according to claim 7, wherein each of said thin-film transistors has a drain and a source electrode which are formed on said semiconductor layer.

9. A liquid crystal display according to claim 8, wherein said insulating layer and semiconductor layer formed on said gate electrode have substantially a same pattern.

10. A liquid crystal display according to claim 9, wherein said source electrode corresponding to each of said thin-film transistors is shaped to have a bending plane pattern.

11. A liquid crystal display according to claim 2, wherein an angle of inclination of an edge surface of said insulating layer is smaller than that of an edge surface of said semiconductor layer.

12. A liquid crystal display comprising:

a substrate;

gate lines formed on said substrate;

data lines intersecting with said gate lines in a matrix shape;

thin-film transistors formed near the intersections of said gate lines and said data lines, respectively, wherein each of said thin-film transistors uses a corresponding one of said gate lines as a gate electrode and each of said thin-film transistors has one of a drain and source electrode which is connected to a corresponding one of said data lines;

pixel electrodes each of which is electrically connected to the other of the drain and source electrode of a corresponding one of said thin-film transistors to drive a liquid crystal material provided in said display, said pixel electrodes being formed on said substrate, respectively;

an insulating layer formed on said substrate along said data lines, respectively, and on said gate electrode of each of said thin-film transistors corresponding thereto; and a semiconductor layer formed on said insulating layer and having substantially a same pattern as that of said insulating layer, wherein said data lines and said source and drain electrodes of each of said thin-film transistors are formed on said semiconductor layer, and wherein said semiconductor layer is dimensioned to have a width which is greater than that of said data lines, respectively.

13. A liquid crystal display according to claim 12, wherein said insulating layer is disposed to be partially overlapping with said pixel electrodes.

14. A liquid crystal display according to claim 12, wherein said semiconductor layer consists of an intrinsic type semiconductor layer.

15. A liquid crystal display according to claim 12, wherein said gate lines are coated with an anodic oxide film, respectively.

16. A liquid crystal display according to claim 12, wherein an angle of inclination of an edge surface of said insulating layer is smaller than that of an edge surface of said semiconductor layer.

17. A liquid crystal display according to claim 12, wherein said source electrode corresponding to each of said thin-film transistors is shaped to have a bending plane pattern.

18. A liquid crystal display according to claim 12, wherein each of said gate lines consists of a single-metal layer and an anodized oxide film of metal formed on upper and side surfaces thereof.

19. A liquid crystal display according to claim 13, wherein said single-metal layer is formed of aluminum.

20. A liquid crystal display according to claim 18, wherein each of said data lines and said source and drain electrodes is constituted by a stacked arrangement of first and second metal layers.

21. A liquid crystal display according to claim 18, wherein each of said data lines consists of a single-metal layer.

* * * * *